US012581915B2

(12) United States Patent
Hou et al.

(10) Patent No.: US 12,581,915 B2
(45) Date of Patent: Mar. 17, 2026

(54) APPARATUS AND METHODS FOR CHEMICAL MECHANICAL POLISHING

(71) Applicant: TAIWAN SEMICONDUCTOR MANUFACTURING COMPANY, LTD., Hsinchu (TW)

(72) Inventors: Te-Chien Hou, Hsinchu (TW);
Chen-Chi Tang, Hsinchu (TW);
Chi-hsiang Shen, Hsinchu (TW);
Jeng-Chi Lin, Hsinchu (TW);
Chen-Hao Wu, Hsinchu (TW);
Shich-Chang Suen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 506 days.

(21) Appl. No.: 18/141,447

(22) Filed: Apr. 30, 2023

(65) Prior Publication Data

US 2024/0363447 A1     Oct. 31, 2024

(51) Int. Cl.
| | |
|---|---|
| *H01L 21/66* | (2006.01) |
| *B24B 37/04* | (2012.01) |
| *G01N 23/2251* | (2018.01) |
| *G06T 7/00* | (2017.01) |
| *H01L 21/321* | (2006.01) |

(52) U.S. Cl.
CPC ............ *H01L 22/12* (2013.01); *B24B 37/042* (2013.01); *G01N 23/2251* (2013.01); *G06T 7/001* (2013.01); *H01L 22/26* (2013.01);

*G01N 2223/6116* (2013.01); *G06T 2207/10004* (2013.01); *G06T 2207/30148* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 10,096,482 B2 | 10/2018 | Hui et al. | |
| 10,643,853 B2 | 5/2020 | Chen et al. | |
| 2008/0031510 A1* | 2/2008 | Jung | ................. H01L 21/67288 |
| | | | 382/149 |
| 2020/0043748 A1* | 2/2020 | Liu | ................... H01L 21/30625 |

FOREIGN PATENT DOCUMENTS

| | | |
|---|---|---|
| CN | 100458712 C | 2/2009 |
| CN | 112355886 A | 2/2021 |
| TW | 202013542 A | 4/2020 |
| TW | 202208842 A | 3/2022 |

* cited by examiner

*Primary Examiner* — Darryl V Dottin
(74) *Attorney, Agent, or Firm* — NZ Carr Law Office

(57) ABSTRACT
Embodiments of the present disclosure relate to a CMP tool and methods for planarization a substrate. Particularly, embodiments of the present disclosure relate to an in-situ defect data analyzer to identify CMP induced defects during polishing processing and cleaning processing performed in the CMP tool. In some embodiments, the CMP tool includes an AI (artificial intelligence)-assisted defect database. The defect database may be used to identify and classify CMP related defects, such as scratch, fall-on slurry residuals, during polishing or cleaning process. As a result, defect warning cycle time for a CMP process is improved significantly.

20 Claims, 20 Drawing Sheets

APPARATUS AND METHODS FOR CHEMICAL MECHANICAL POLISHING

BACKGROUND

During the manufacture of integrated circuits (ICs), multi-step sequences of semiconductor manufacturing processes are performed to gradually form electronic circuits on semiconductor substrates. One such semiconductor manufacturing process sequence is chemical mechanical polishing (CMP). CMP is a process for smoothing or planarizing surfaces using a combination of chemical and mechanical forces. Among other things, CMP advantageously allows features of the electronic circuits to be more precisely formed. As the device dimension scales down, byproducts, agglomerated abrasives, pad debris, slurry residues, and other particles on the substrate surface during related CMP process may cause higher level of defects, reducing product yield rate.

CMP-induced defects, such as scratch, fall-on, residue, are identified after the CMP process when substrate exit the CMP system. For example, defects may be classified and identified more than 40 hours after the defects occurred. During this period, substrates are still processed through the CMP system, causing additional defects. Therefore, there is a need to improve defect detection process for CMP.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
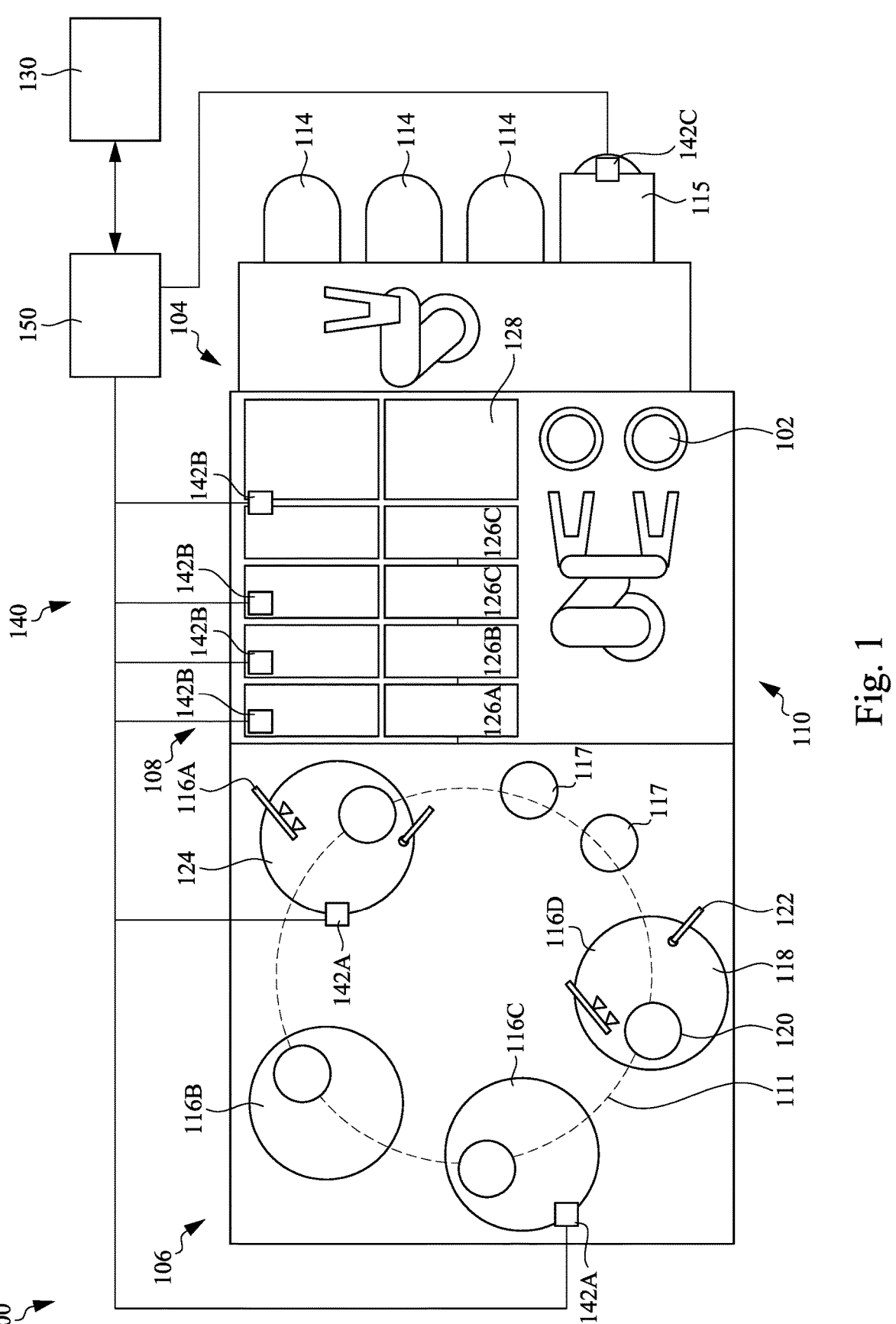
FIG. 1 is a schematic block diagram of a CMP tool according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure relate to a CMP tool and methods for planarization a substrate. Particularly, embodiments of the present disclosure relate to an in-situ defect data analyzer to identify CMP induced defects during polishing processing and cleaning processing performed in the CMP tool. In some embodiments, the CMP tool includes an AI (artificial intelligence)-assisted defect database. The defect database may be used to identify and classify CMP related defects, such as scratch, fall-on slurry residuals, during polishing or cleaning process. As a result, defect warning cycle time for a CMP process is improved significantly.

FIG. 1 is a schematic block diagram of a CMP tool 100 according to embodiments of the present disclosure. The CMP tool 100 is configured to process substrates 102 sequentially through a plurality processing stations to planarize the substrates 102. The CMP tool 100 includes a factory interface 104, a polishing module 106, a cleaning module 108, and a transfer module 110. The CMP tool 100 includes a DDA module 140 configured to detect CMP induced device in-situ. The CMP tool 100 may further include a controller 130 to facilitate control of the planarizing, cleaning, defect monitoring, and transfer processes.

The factory interface 104 generally includes an interface robot 112. One or more front opening unified pods (FOUPs) 114 may be attached to the factory interface 104. The interface robot 112 transfers substrates 102 to be processed from the one or more FOUPs 114 to the polishing module 106 and from the cleaning module 108 to the one or more FOUPs 114. In some embodiments, the factory interface 104 may include two interface robots 112, one for handling substrates prior to being processed in the CMP tool 100, and the other for handling substrates after being processed in the CMP tool 100, to reduce cross contamination via substrate handling robots.

The polishing module 106 includes one or more polishing stations 116A, 116B, 116C, 116D (collectively 116), each configured to perform a particular polishing operation. Each polishing station 116 may include a platen 118 having a polishing pad 119, a pad conditioner 122, and a slurry nozzle 124. Multiple carrier heads 120 are disposed over the polishing stations 116 and configured to polish a substrate against the polishing pad 119 on the polishing stations 116.

In FIG. 1, the CMP tool 100 further includes one or more load cups 117 configured to receive a substrate in a face down position. A track 111 is disposed over the polishing stations 116 and the load cups 117. The carrier heads 120 among the load cups 117 and the polishing stations 116, where the carrier heads 120 can load, polish and unload substrates. Alternatively, the carrier head 120 may be stationed above a corresponding polishing station 116, and substrates being processed may be transferred to and from the carrier head 120 by a substrate transfer robot.

In some embodiments, all the polishing stations 116 are configured to perform the same processing task on different substrates 102. In other embodiments, the polishing stations 116 are configured independently to allow different processing tasks to be performed on different substrates 102 at the same time, for example to achieve various polishing steps in a CMP operation. For example, in a CMP operation includes two polishing steps, a rough polish and a fine polish, the polishing module 106 may include a first polishing station configured to perform the rough polish and a second polishing station configured to perform the fine polish.

The polishing module 106 includes four polishing stations 116A, 116B, 116C, 116D. Depending on the thickness and type of material to be removed from a substrate, the polishing stations 116A, 116B, 116C, 116D differ by type and chemistry of a polishing slurry used, roughness of the respective polishing pads, and process recipe such as spin rate, force applied to the substrate, and duration of the polish. In some embodiments, the polishing stations 116A, 116C are configured to perform a first chemical mechanical polish while the polishing stations 116B, 116D are configured to perform a second chemical mechanical polish. In some embodiments, the first chemical-mechanical polish may be a rough polish and the second chemical-mechanical polish may be a fine polish. In some embodiments, the first chemical-mechanical polish may be configured to remove dielectric material from the substrate and the second chemical-mechanical polish may be configured to remove metal from the substrate. During operation, a substrate 102 may be processed first in the polishing station 116A or 116C for the first polishing step, and then in the polishing station 116B or 116D for the second polishing step.

After processing in each of the polishing stations 116, contaminants are left on the surface of the substrates. For example, the contaminants include residues of the abrasive particles and chemical additives from the polishing slurry, and residues from the polished surfaces. The cleaning module 108 is configured to remove contaminants from the polished substrate.

In some embodiments, the cleaning module 108 includes two or more a cleaning stations 126 configured to perform a multi-stage cleaning process. The cleaning stations 126 may be configured differently to clean the substrate using different cleaning techniques. In the embodiments of FIG. 1, the cleaning module 108 includes three cleaning stations 126A, 126B, 126C. The cleaning station 126A may be a cleaning tank, such as a megasonic tank. The cleaning station 126B may be a precleaning tank. The cleaning station 126C may be a brush box. Although three cleaning stations 126A, 126B, 126C are illustrated and described, the cleaning module 108 may comprise any number of cleaning stations. In some embodiments, the cleaning module 108 further includes a drying station 128. For example, after polishing, substrates 102 are sequentially transported through the different cleaning stations 126 to remove contaminants from surfaces of the substrates and the drying station 128 before exit the cleaning module 108. In some embodiments, the drying station 128 is a spin-rinse-dry module within which the substrate 102 is rinsed with deionized substrate and then dried before exiting the cleaning module 108. In other embodiments, the drying station 128 may be a Marangoni vapor dryer using vapor of isopropyl alcohol (IPA).

The transfer module 110 is operable to load and unload substrates from various polishing stations 116 and cleaning stations 126. The transfer module 110 is configured to transfer substrates 102 among various polishing and cleaning stations when the substrates 102 are being processed in the CMP tool 100. For example, the transfer module 110 is configured to transfer substrates 102 between the polishing module 106 and the cleaning module 108. In the CMP tool 100 of FIG. 1, the transfer module 110 includes a robot with two substrate handling blades to handle two substrates 102 simultaneously.

In some embodiments, the CMP tool 100 further includes an integrated metrology tool 115. The metrology tool 115 may be attached to the factory interface 104. Alternatively, the metrology tool 115 may be positioned in other locations in the CMP tool 100, for example, in the polishing module 106 or in the transfer module 110. The metrology tool 115 is configured to measure various parameters of the substrates 102 being processed. The metrology tool 115 may be configured to measure the substrates 102, prior to, during, or post processing in the CMP tool 100.

For example, the metrology tool 115 may measure substrate parameters, such as hardness, sheet resistance, reflectivity, stress, particle density, and critical dimension. In some embodiments, the metrology tool 115 measures a thickness of the substrate 102, or a thickness of a material layer of the substrate 102, at various times during processing in the CMP tool 100. In some embodiments, the metrology tool 115 may classify defects and features of the substrate 102.

The metrology tool 115 includes any type of metrology tools known in the art, or future-developed metrology tool. The metrology tool 115 includes electrical, optical, and/or analytical tools, such as microscopes (e.g., scanning electron microscopes and/or optical microscopes), micro-analytical tools, line width measurement tools, mask and reticle defect tools, particle distribution tools, surface analysis tools, stress analysis tools, resistivity and contact resistance measurement tools, mobility and carrier concentration measurement tools, junction depth measurement tools, film thickness tools, gate oxide integrity test tools, C-V measurement tools, focused ion beam (FIB) tools, laser surface defect scanners, residual gas analyzers, process tool particle counters, other metrology tools, or combinations thereof.

The system controller 130 controls various processes within the CMP tool 100. In some embodiments, the system controller 130 controls CMP processes implemented by CMP tool 100, particularly providing target thickness and surface profile uniformity control. For example, by evaluating surface profiles of incoming substrates, the system controller 130 determines an operation mode, and a CMP polishing recipe, for the CMP tool 100. In some embodiments, the system controller 130 may analyze information either from the metrology tool 115 or a database. The system controller 130 may comprise a computer that can be a conventional, commercially available computer, or any other suitable computer hardware. The computer may be a general purpose or specific purpose computer. The hardware of the system controller 130 includes a processor and a computer readable medium. The computer readable medium stores a computer program that is executed by the processor, and that causes the computer to control various modules of the CMP tool 100. The computer is operable to perform actions including manipulating information, receiving information, storing information, and transferring information.

The DDA module 140 is configured to identify CMP induced defects in-situ and to trigger remedial actions immediately. In some embodiments, the DDA module 140 includes one or more data collection units 142 disposed in various processing stations in the CMP tool 100, and a data analyzing unit 150 connected to the one or more data collection units 142.

The data collectors 142 gathers various measurement data, such as images of the substrate surface, at the point of processing, stores the measurement data, and sends the measurement data to the data analyzing unit 150. The data collectors 142 may include one or more high-speed cameras configured to recording fast moving objects, such as rapid rotating substrates during polishing and cleaning in the CMP tool 100. In some embodiments, the data collectors 142 may include an illuminator configured to project desired lighting to the substrate being processed, such as laser light, polarized light, etc. The high-speed camera and the illuminator may be disposed at various relative angles to capture different surface characters.

The data collectors 142 may be disposed in various locations in the CMP tool 100, such as in the polishing module 106, in the cleaning module 108, and/or in the factory interface 104. In some embodiments, the CMP tool 100 may include two or more data collectors 142 disposed in two or more locations of the CMP tool 100. The two or more data collectors 142 capture defect information at various stages of the processing in the CMP tool 100 and enables rapid location of the source of the defect, thus, improving efficiency of remedial actions.

In some embodiments, one or more data collectors 142A may be positioned in one or more the polishing stations 116A, 116B, 116C, 116D in the polishing module 106 to gather substrate surface information during one of the polishing steps, such as in rough polishing or fine polishing. In some embodiments, one or more data collectors 142B may be positioned in one or more the cleaning stations 126A, 126B, 126C or the drying station 128 to gather substrate surface information during one of the cleaning steps. In some embodiments, a data collectors 142C is disposed in the metrology tool 115, which enabling data collecting at various stages. In some embodiments, the data colleting unit 142C in the metrology tool 115 may be one of built-in metrology apparatus in the metrology tool 115, which is connected to the data analyzing unit 150. In other embodiments, the data collectors 142C may be an add-on sensor, such as an add-on camera, to the metrology tool 115, and used to transmitting measurement data to the data analyzing unit 150.

The data analyzing unit 150 processes the measurement data from the data collectors 142 to extract defects of interest (DOIs), classify the DOIs, and compare the extracted DOIs with a database to determine the degree of defects. The data analyzing unit 150 may be configured to readout various defects related to a CMP process, such as scratches, concaves (dishing), particle contaminations etc. If the data analyzing unit 150 determines that the degree of defects is non-tolerable, e.g., the degree of defect would result in device failure or other issues, the data analyzing unit 150 determines that a non-tolerable defect has occurred, the data analyzing unit 150 would send a warning signal, for example, to the system controller 130, so that remedial actions may be taken.

In some embodiments, the data analyzing unit 150 would compare the extracted DOIs with a machine learning defect database to determine the degree of the defects. In some embodiments, the machine learning defect database may be continuously improved using feedback of defect review of the measured data from the data collectors 142. For example, a substrate 102 being processed in the CMP tool 100 may be taken out of the CMP tool 100 while between process steps for a SEM (scanning electron microscopy) review. The review results would be used as a feedback to fine tune the defect database. In some embodiments, the SEM review may be performed between processing steps during queue time without affect normal CMP operations in the CMP tool 100. Alternatively, the SEM review may be selectively performed by sampling a portion of the substrates being processed.

With the DDA module 140, the CMP tool 100 according to the present disclosure is capable of provide in-situ defect warnings during CMP process. As discussed above, defects occurred during a CMP process are conventionally identified after substrates exit a CMP tool using an off-site defect inspection tool. The time lapse from defect occurrence to identification may be about 42 hours. During the time lapse many substrates have been processed in the damage causing CMP tool, resulting in many defect substrates. The CMP tool 100 according to the present disclosure is capable of identify defects within one hour of defect occurrence, therefore, greatly improving defect identification efficiency and significantly lowering cost of ownership for manufacturers.

Figure 2:
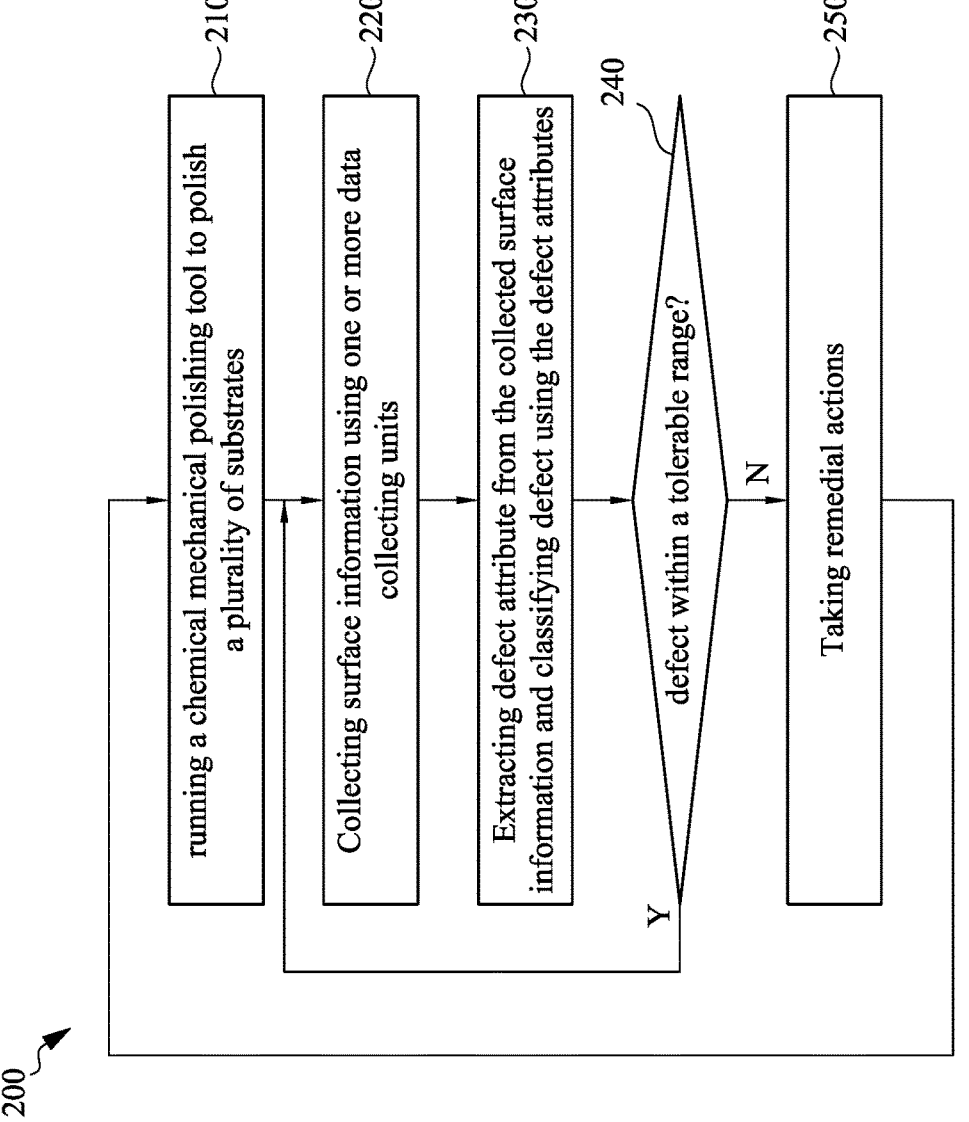
FIG. 2 is a flow chart of a method for operating a CMP tool according to some embodiments of the present disclosure.

FIG. 2 is a flow chart of a method 200 for performing a CMP process according to some embodiments of the present disclosure. The method 200 may be performed using a CMP tool according to the present disclosure, such as the CMP tool 100 in FIG. 1.

In operation 210, a CMP tool starts running and a plurality of substrates sequentially enter the CMP tool to be processed. During operation, multiple polishing stations and cleaning stations in the CMP tool run at the same time to process the plurality of substrates. Each substrate sequentially goes through the polishing stations 116 and the cleaning stations 126 according to the process recipe.

In some embodiments, each substrate 102 enters the CMP tool 100 through one of the FOUPs 114, the substrate 102 is then transferred from the FOUP 114 through the factory interface 104 and the transfer module 110 to the load cups 117 in the polishing module 106; one of the carrier heads 120 then picks up the substrate 102 from the load cup 117, moves along the track 111, and presses the substrate 102 against the first polishing station 116, where a rough polishing operation is performed; after the rough polishing operation, the carrier head 120 moves again along the track 111 to a second polishing station 116, where a fine polishing operation is performed; the carrier head 120 then returns the substrate 102 to the load cup 117. For CMP recipes with more than two polishing steps, the substrates 102 may be processed in more than two polishing stations.

Upon completing all polishing steps, the substrate 102 is transferred from the polish module 106 to the cleaning module 108, where the substrate 102 sequentially goes through the cleaning stations 126A, 126B, 126C and the drying station 128 to be cleaned. In some embodiments, the cleaning station 126A is a megasonic cleaning station configured to dislodge contaminants from the substrate using megasonic energy applied to the cleaning solution to agitate the cleaning solution. The cleaning station 126B is a scrub cleaning station, where the substrate 102 is scrubbed by cleaning pads as a cleaning solution is sprayed on the substrate 102, thereby removing contaminants from surfaces of the substrate 102. The cleaning station 126C is a brush cleaning station, where the substrate 102 is scrubbed by cleaning brushes as a cleaning solution is sprayed to the substrate 102, thereby removing contaminants from surfaces of the substrate 102. The drying station 128 is configured to rinse and dry the substrate 102 by deionized water or isopropyl alcohol (IPA).

Upon completing of the cleaning steps, the substrate 102 is returned to the FOUP 114 through the factory interface 104. In some embodiments, the CMP recipe may include transferring the substrate 102 to the metrology tool 115 to be inspected. The inspection may be performed between any polishing and cleaning steps.

In operation 220, surface information of the substrate being processed is collected using one or more data collectors, such as the data collectors 142 in the CMP tool 100, while the substrates are being processed in the CMP tool. In some embodiments, the surface information may be images of the substrate surface or a portion of the substrate. The images may be taken by highspeed cameras with various light sources and from various angles. In some embodiments, the surface information may be collected at a predetermined time interval to continuously monitor a particular process. In some embodiments, the surface information may be collected to capture various locations on the substrate surface. In some embodiments, the surface information may be collected at the end of a polishing or a cleaning step.

In some embodiments, surface information is collected from at least one processing station, such as in the polishing station 116. In some embodiments, surface information is collected at multiple locations at multiple stages of the CMP process. As shown in the CMP tool 100 of FIG. 1, surface information may be collected using the data collectors 142A, 142B, 142C while the substrate is being processed at rough polishing, fine polishing, pre-clean, scrub cleaning, brushing cleaning, drying, and during inspection.

In some embodiment, when a particular substrate is being processed sequentially through processing stations in the CMP tool, first images of the substrate are taken in a first processing station, second images of the substrate are taken in a second processing station, defects shown extracted from the first images and second images may be used to determine the source of particular defect.

The surface information captured include total defects, i.e., defects from pre-layer and CMP induced defects. In some embodiments, surface information of pre-layer or pre-layer defects may be captured by comparing the first images and second images. The surface information of the pre-layer may be used to distinguish identify pre-layer defects with CMP defects in the subsequent analysis.

In operation 230, the surface information is analyzed to extract and classify defect information. Operation 230 may be performed in a data analyzing unit, such as the data analyzing unit 150.

In some embodiments, the surface information may be transferred in real time from the data collectors 142 to the data analyzing unit 150. The data transfer may be achieved using any suitable communication channel, such as via a wired communication, a wireless communication, or via a combination of wired and wireless network.

The defect information may be analyzed by any suitable methods known to persons skilled in the art. In some embodiments, the images captured by the data collectors 142 may be processed with reference images to detect any defects. Attributes of the defects are then extracted from the captured image with defects and from the reference images. The attributes may be gray level, contrast, size, etc. The attributes are then used to classify the defects into different categories, such as corrosion, hump, scratch, particle, residue, roughness, etc. After clarification, defects of interest (DOIs), such as scratches, concaves, and particles, may be further analyzed to determine if the process running in the CMP tool is in good order. When multiple data collectors 142 are used to capture defect information in multiple polishing stations, the source of a defect may be identified by comparing defect information from the multiple data collectors 142. Pre-layer defects and CMP induced defects may also be distinguished from surface information captured in various processing stations.

In operation 240, the DOIs detected in operation 230 are reviewed to determine if the detected defects are within a tolerable range. If a detected defect is outside the tolerable range, operation 250 is performed to take remedial actions. If the detected defects are within the tolerable range, operations 220, 230, 240 may be repeated while the CMP tool is running normal operation.

In some embodiments, reviewing the DOIs is performed by comparing the DOIs with information in a defect database. In some embodiments, the defect database may include tolerable ranges of attributes for various defects at various stages of the CMP process in the CMP tool. In some embodiments, the defect database may be improved by artificial intelligence, for example, information in the defect database may be fine-tuned by machine learning. In some embodiments, substrates in the CMP tool may be taken out for a SEM review to provide feedback to the defect database. Results from the SEM review may be used to update, enlarge, or otherwise improve the defect database using suitable machine learning algorithms.

In some embodiments, the substrates being processed in the CMP tool may be taken out for a SEM review when taking the substrate out of the CMP tool does not affect queue time. For example, a SEM review may be performed during wait time.

In operation 250, remedial actions are taken to address the detected defects. In some embodiments, the remedial actions may include sending a warning signal to the operator or the system controller 130. The operator or the system controller 130 may determine a suitable action according to the detected defects, such as the type and degree of the defects, the process station where the defect is detected. A suitable remedial action may include shutting down the CMP tool, conditioning the polishing pad, adjusting processing parameters, such as adjusting polishing slurry, adjusting cleaning solution, time, pressure, taking out affected substrates, etc.

Figure 3A:
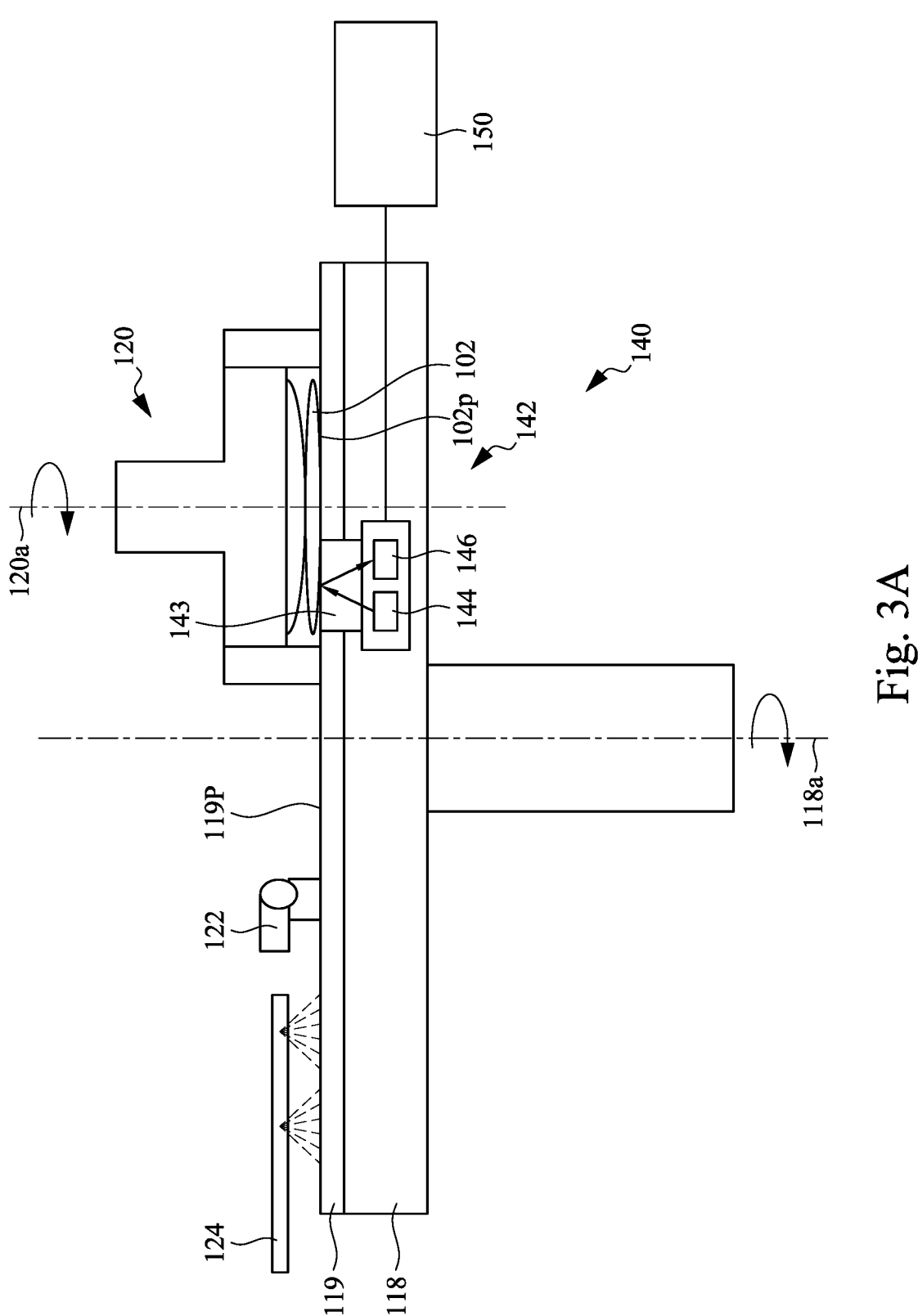
FIG. 3A is a schematic sectional view of a defect data analyzer (DDA) with a data collectors disposed in a polishing station according to some embodiments of the present disclosure.
Figure 3B:
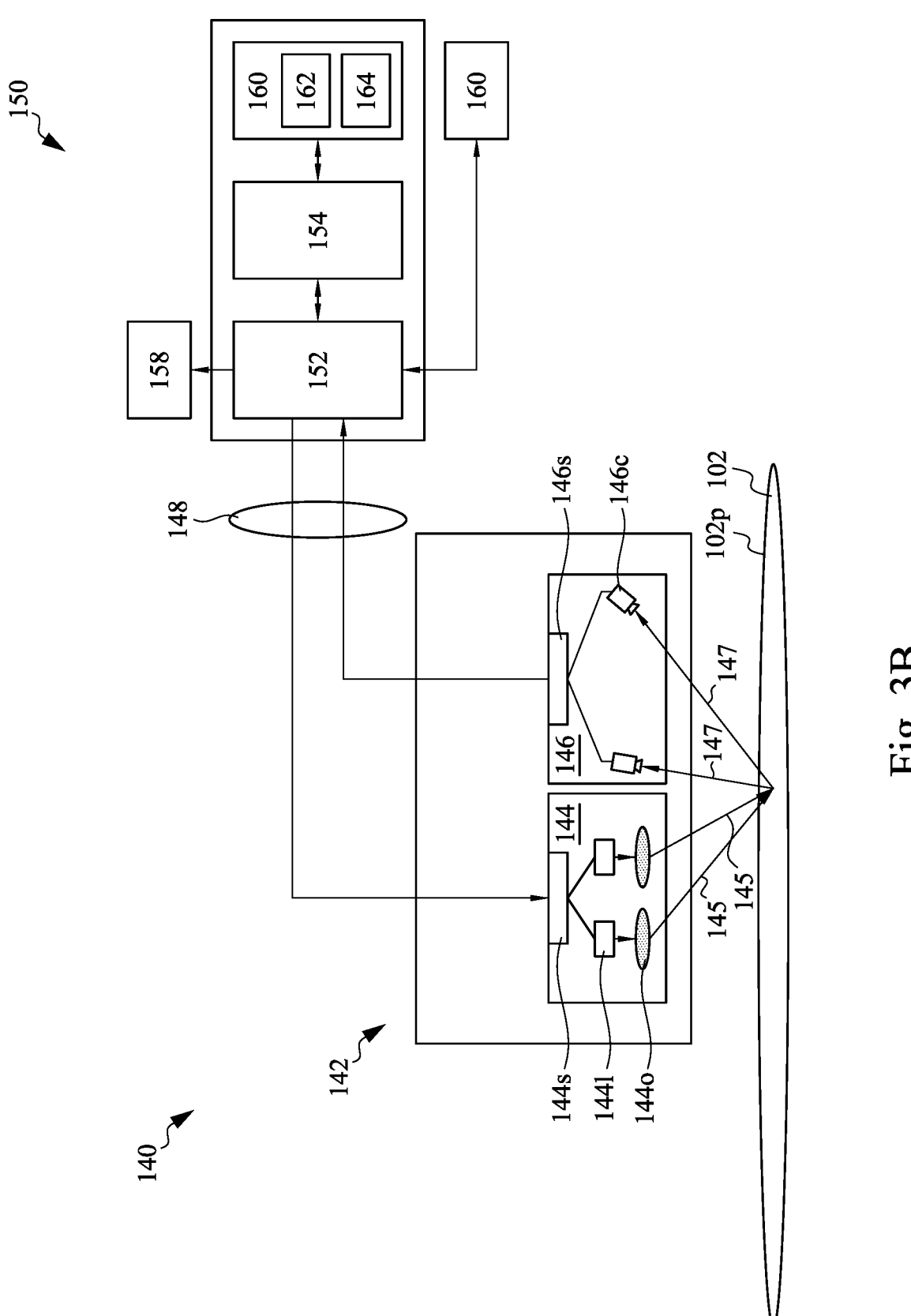
FIG. 3B is a schematic block diagram of a defect data analyzer (DDA) according to embodiments of the present disclosure.

FIG. 3A is a schematic sectional view of the DDA module 140 with a data collector 142 disposed a polishing station 116 according to embodiments of the present disclosure. FIG. 3B is a schematic block diagram of the DDA module 140 according to embodiments of the present disclosure.

The polishing station 116 includes the platen 118 covered by the polishing pad 119 having a polishing surface 119p. In some embodiments, the polishing pad 119 may be adhered to the platen 118 through vacuum force. The platen 118 may include a series of distributed holes operatively connected to a vacuum system allowing the polishing pad 119 to be subjected to an appropriate vacuum. During operation, the platen 118 rotates with the polishing pad 119 about a central axis 118a.

The carrier head 120 is configured to retain a substrate 102 with a surface 102p to be processed facing the polishing pad 119. In some embodiments, the carrier head 120 stays within a particular polishing station 116. In other embodiments, the carrier head 120 travels among the polishing stations 116 in the CMP tool 100. The substrate 102 may be held by vacuum to the carrier head 120 or held thereto by a backing film or a membrane. In some embodiments, the substrate 102 is retrained by a retainer ring attached to the carrier head 120. During polishing, the carrier head 120 may rotate the substrate about a central axis 120a. The central axis 120a of the carrier head 120 and the central axis 118a of the platen 118 are positioned off set from each other so that the surface 102p of the substrate 102 may uniformly contact the polishing surface 119p.

The slurry nozzle 124 is configured to introduce a polishing slurry to the polishing pad 119 on the platen 118. The polishing slurry may include abrasive particles and chemicals to enable chemical mechanical polishing process. Exemplary slurries may comprise abrasive particles suspended in an alkaline, neutral, or acidic solution, depending upon the process requirement, i.e., chemical etchants and colloid particles. In some embodiments, the polishing slurry may include one or more chemicals such as oxidizing agents, chelating agents, corrosion inhibitors, stabilizing agents, and/or pH adjusting agents. Designs of the polishing pad and composition of the slurry are selected according to handle different polishing tasks, such as wafers with different material composition to be removed, amount of material to be removed, etc. The pad conditioner 122 is configured to prepare and condition the surface of the polishing pad 119 on the platen 118 during, before and/or after CMP processes. The pad conditioner 122 may include a conditioner head attached to a pivot arm.

During polishing, the platen 118 and the carrier head 120 are rotated about different axes 118a and 120a to remove material and even out irregular topographies on the surface 102p of the substrate 102. In some embodiments, the carrier head 120 may also swing related to the platen 118. The rotating carrier head 120 presses the substrate 102 against the rotating polishing pad 119 on the platen 118, and slurry containing chemical etchants and colloid particles are introduced using the slurry nozzle 124 onto the polishing pad 119. Through this active rotation of the substrate 102 on the polishing pad 119 on the platen 118 under pressure in a presence of a polishing medium, irregularities on the wafer surface are removed during one or more CMP processes thereby resulting in a planarization of the substrate 102.

In some embodiments, the DDA module 140 includes a data collector 142 disposed in the platen 118. The data collectors 142 may include an illuminator 144 and a collection unit 146. The illuminator 144 is configured to direct impinging light beams 145 towards the surface 102p of the substrate 102. The impinging light beams 145 encounter the surface 102p of the substrate 102 and are reflected in the form of the reflection lighting beams 147. The collection unit 146 is configured to capture the reflecting light beams 147 from the substrate 102. An aperture 143 may be formed through the polishing pad 119 so that a portion of the substrate surface 102p may be exposed to the data collectors 142. The aperture 143 allows passage of the impinging light beams 145 and the reflecting light beams 147. In some embodiments, the aperture 143 may be a window filled with a transparent material, such as polycarbonate, quartz, optical grade silicon, or any suitable material. In some embodiments, the aperture 143 may have a diameter in a range between about 1 mm and about 10 mm.

The illuminator 144 may include one or more light sources 144l and one or more optics 144o configured to tune the light beams from the light sources 144l. In some embodiments, the illuminator 144 further includes a switch 144s configured to selectively activate the one or more light sources 144l. In some embodiments, the one or more light sources 144l may be one or more laser light sources. The light sources 144l may be any suitable light sources.

The one or more light sources 144l may be oriented at different angles to generate light beams 145 at different angles relative to the substrate surface 102p. FIG. 3D is a block diagram of a light source arrangement in the illuminator 144 according to embodiments of the present disclosure.

As shown in FIG. 3D, the illuminator 144 may include a normal light source 144ln and an oblique light source 144lo. The normal light source 144ln and the oblique light source 144lo may be alternatively activated by the switch 144s for the data collectors 142 to work at a normal light (NL) mode and an oblique light (OL) mode. Different types of defects may have scatter impinging beams differently. By providing the NL mode and the OL mode, the illuminator 144 improves light scattering from different defects, therefore, optimizing defect detection.

The normal light source 144ln is positioned to impinge a light beam 145n substantially perpendicular to the substrate surface 102p. In some embodiments, an angle between the impinge light beam 145n and a normal vector 102n of the substrate surface 102p is less than about 10 degrees. The oblique light source 144lo is positioned to impinge a light beam 145o, which is at an oblique angle to the substrate surface 102p. In some embodiments, an angle a between the light beam 145o and the normal vector 102n of the substrate surface 102p is in a range between less than about 10 degrees and about 90 degrees, for example, in a range between less than about 45 degrees and about 70 degrees.

The one or more optics 144o may include one or more polarizers, graters, optical lens, and the like. In some embodiments, the one or more optics 144o includes one or more polarizers. FIG. 3E schematically illustrates various light source polarization in the illuminator 144 according to embodiments of the present disclosure. As shown in FIG. 3E, the optics 144o may include polarizers to generate p-polarized beams 145pp, s-polarized beams 145sp, and c-polarized beams 145cp.

The collection unit 146 may include one or more high-speed cameras 146c configured to capture images of fast-moving objects, such as the rotating substrate 102 during polishing and cleaning. In some embodiments, the collecting unit 146 may include a storage medium, such as flash memory, to store images captured by the high-speed cameras 146c. In some embodiments, the one or more high-speed cameras 146c may be positioned at different angles relative to the substrate surface 102p to capture images including information of different characteristics. In some embodiments, the collection unit 146 may include a controller 146s to selectively activate the one or more cameras 146c. For example, the controller 146s may be used to synchronize the one or more high-speed cameras 146c. In some embodiments, two or more high-speed cameras 146c may be synchronized to capture images of the substrate surface 102p from different angles. Images from different cameras may be used to reduce noises and increase signal/noise ratio.

Figure 3C:
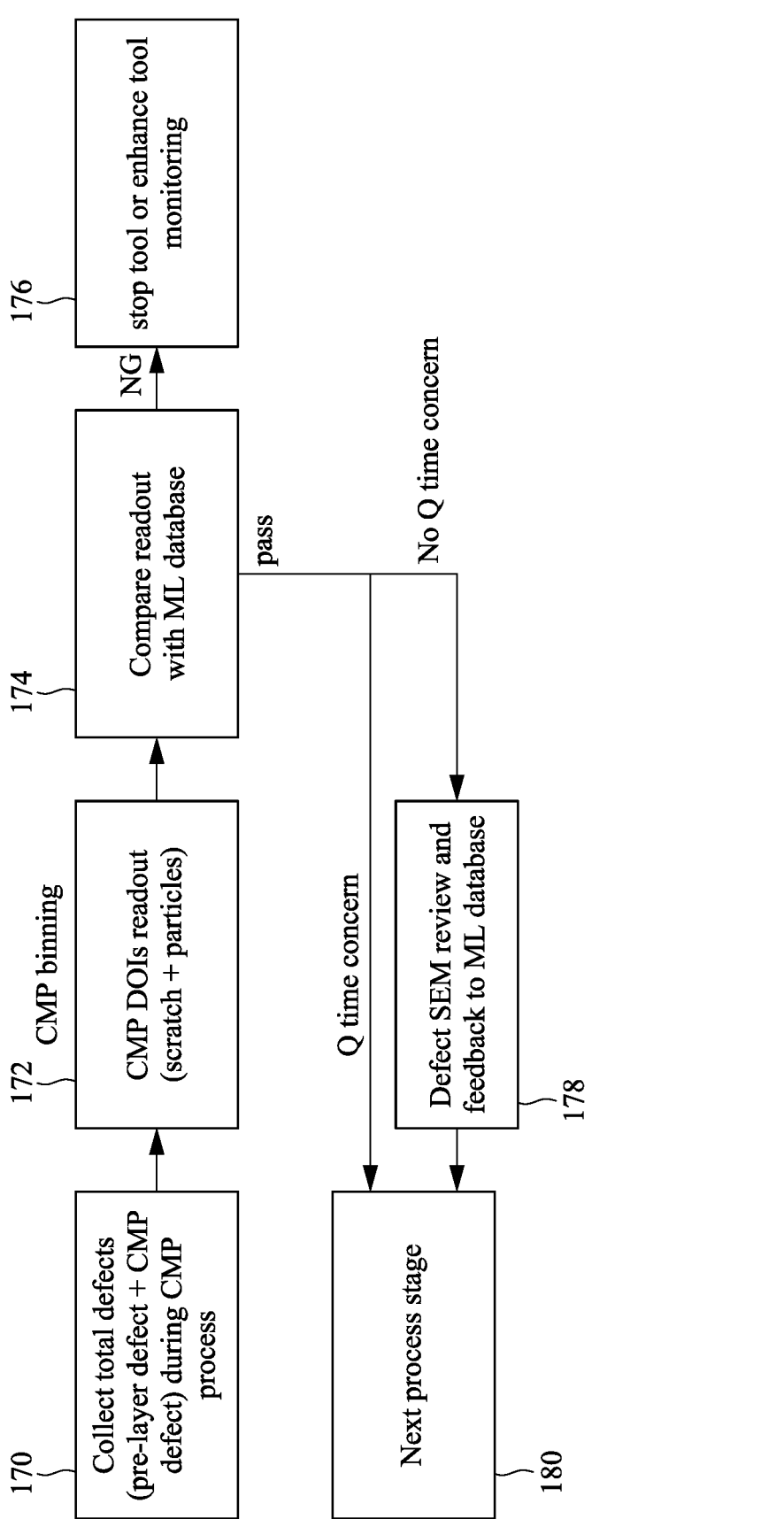
FIG. 3C is an operation diagram of a defect data analyzer (DDA) according to embodiments of the present disclosure.
Figure 3D:
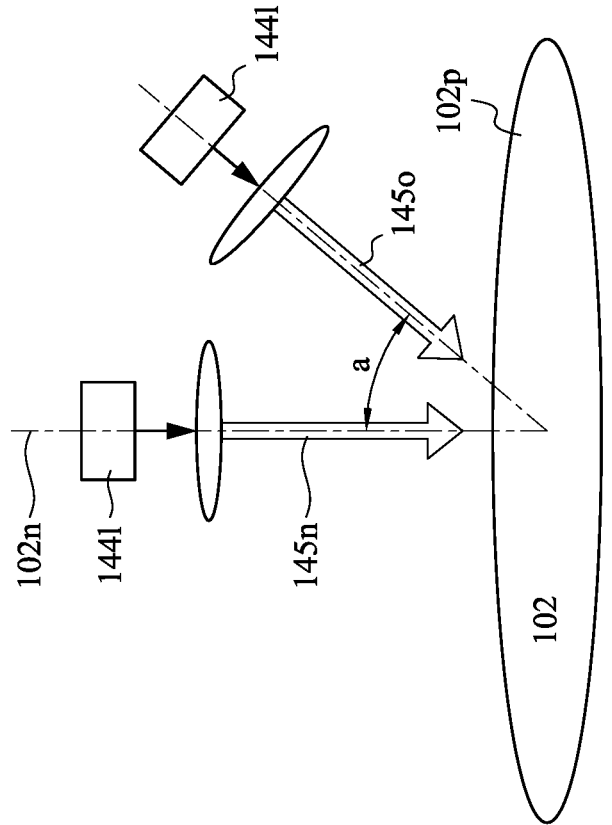
FIG. 3D is a block diagram of a light source arrangement in a data collector according to embodiments of the present disclosure.
Figure 3E:
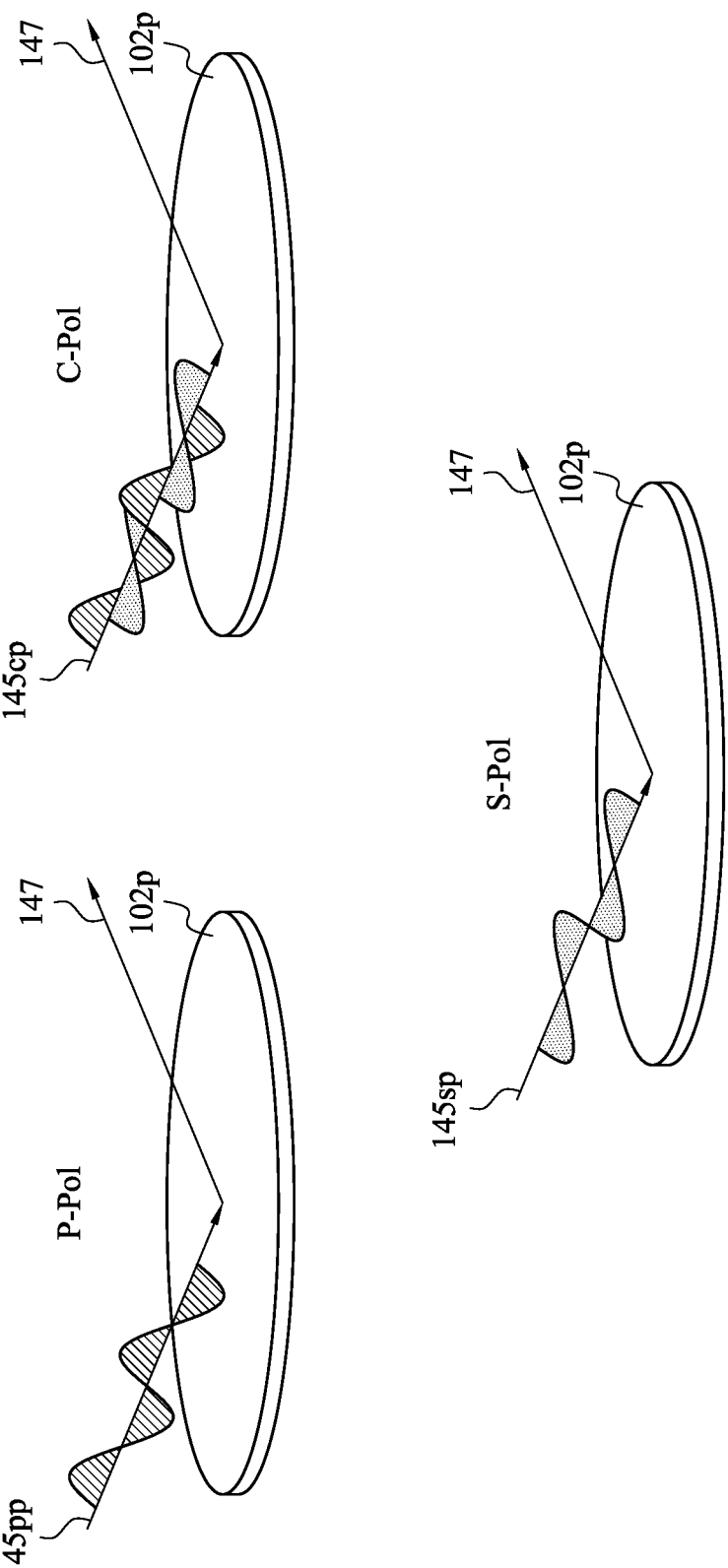
FIG. 3E schematically illustrates various light source polarizations in a data collector according to embodiments of the present disclosure.
Figure 3F:
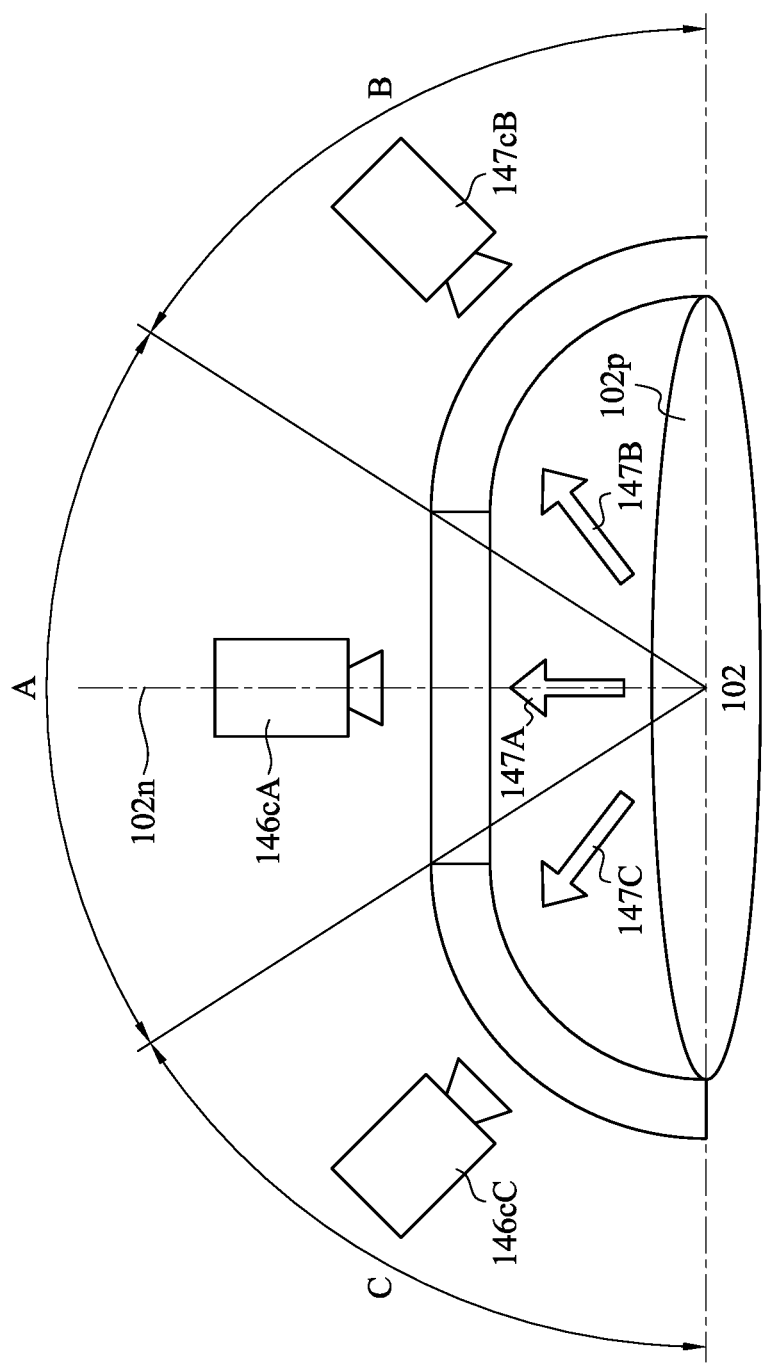
FIG. 3F is a block diagram of a collection channel arrangement in a data collector according to embodiments of the present disclosure.

FIG. 3F is a block diagram of a camera arrangement in the data collectors 142 according to embodiments of the present disclosure. As shown in FIG. 3F, the data collectors 142 includes three high-speed cameras 146cA, 146cB, 146cC. Each of the high-speed cameras 146cA, 146cB, 146cC provides a channel to capture images of the substrate surface 102p from a certain angle. In the arrangement of FIG. 3F, the high-speed camera 146cA is positioned to capture reflecting light beams 147A projected towards region A above the region of interest on the substrate 102 and the high-speed camera 146cB, 146cC are positioned to capture reflecting light beams 147B, 147C reflected towards regions B and C respectively. The high-speed camera 146cA provides a central channel while the high-speed cameras 146cB, 146cC provide two side channels. In some embodiments, the region A may include an area above the substrate surface 102p with an angle A from the normal vector 102n of the substrate surface 102p. In some embodiments, the angle A is in a range between about 10 degrees and 45 degrees. In some embodiments, the region B may include an area above the substrate surface 102p with an angle B from the substrate surface 102p. The regions B and C are disposed on opposite side of the region A. In some embodiments, the angle B is in a range between about 45 degrees and 80 degrees. The region C may include an area above the substrate surface 102p with an angle C from the substrate surface 102p. In some embodiments, the angle C is in a range between about 45 degrees and 80 degrees.

Figure 3G:
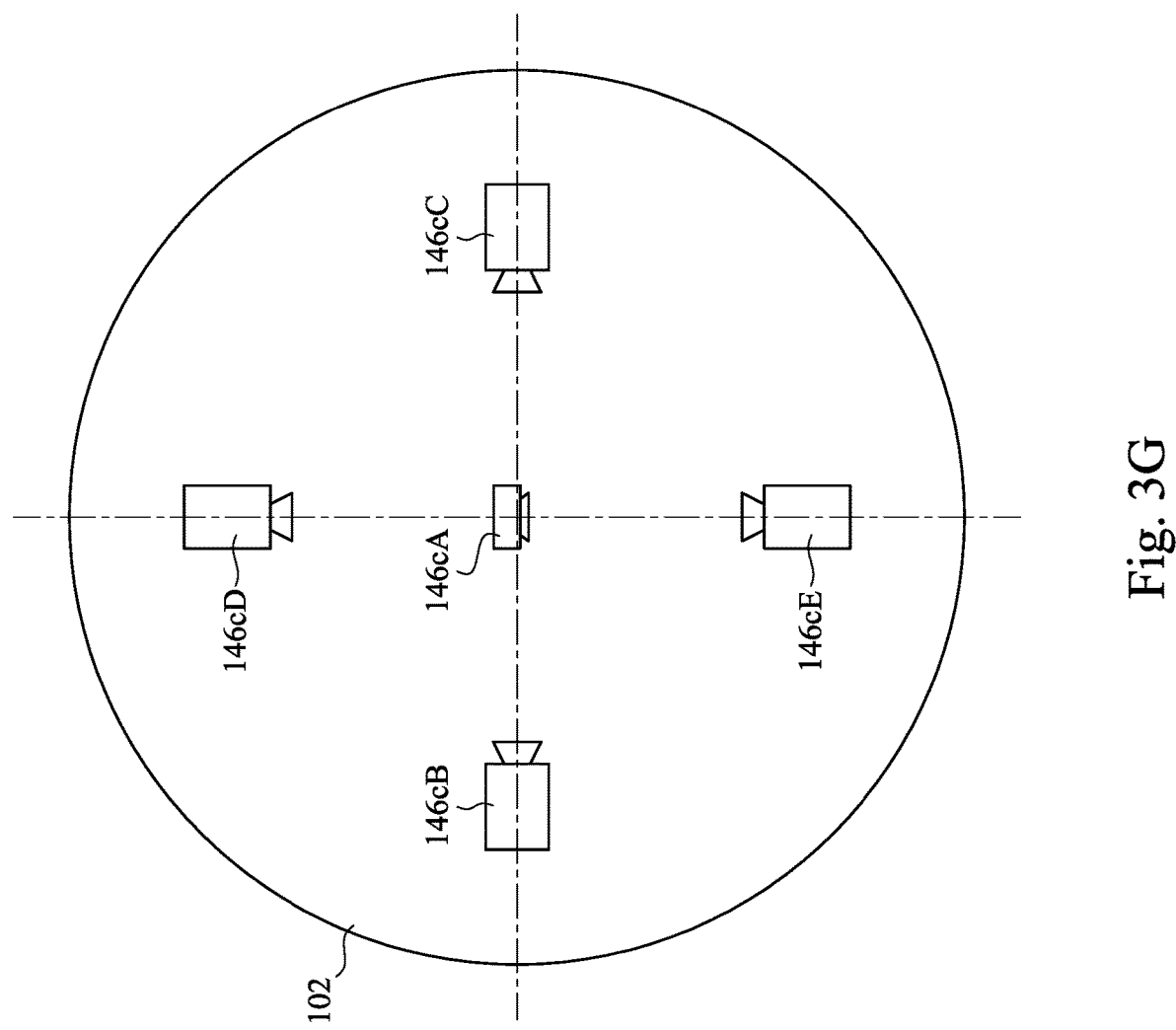
FIG. 3G is a plan view of a collection channel arrangement in a data collector according to embodiments of the present disclosure.

FIG. 3G is a plan view of a collection channel arrangement in the collection unit 146 according to embodiments of the present disclosure. The arrangement in FIG. 3G is similar to the arrangement in FIG. 3F except there are more than two side channel high-speed cameras. In the arrangement of FIG. 3G, the collection unit 146 includes one high-speed camera 146cA as a central channel and a plurality of high-speed cameras 146cB, 146cC, 146cD, 146cF distributed around the central channel high-speed camera 146cA as side channels. The plurality of side channel high-speed cameras 146cB, 146cC, 146cD, 146cF may be evenly distributed about the central channel high-speed camera 146cA to capture areas of interest at multiple angles. Even though four side channel high-speed cameras 146cB, 146cC, 146cD, 146cF are shown, less or more side channel high-speed cameras may be used.

Referring to FIGS. 3A and 3B, the DDA module 140 includes the data analyzing unit 150, which is in connection with one or more data collectors 142. During operation, the data analyzing unit 150 may send data capture commands to the data collectors 142 and receive captured images from the data collectors 142. In some embodiments, the data analyzing unit 150 is disposed remotely from the data collectors 142 and may be used to control and monitor multiple data collectors 142. The one or more data collectors 142 are in connection with the data analyzing unit 150 by a communication means 148. The communication means 148 may be a wired connection, a wireless connection, or a remote connection via the internet.

In some embodiments, the data analyzing unit 150 may be disposed adjacent the data collectors 142 in the processing station, such as the polishing station 116. In other embodiments, each data collectors 142 may include a dedicated data analyzing unit 150 and forming a stand-alone in-situ defect monitor.

In some embodiments, the data analyzing unit 150 comprise a computer that can be a conventional, commercially available computer, or any other suitable computer hardware. The computer may be a general purpose or specific purpose computer. The computer may include an I/O interface 152, a processor 154, and a computer storage medium 156. The computer storage medium 156 may store a defect analyzing program 162 and a defect database 164. The defect analyzing program 162 may be executed by the processor 154 to perform defect analyzation by collecting surface information via the I/O interface 152, analyzing the collected surface information to extract defect attributes, and comparing the defect attributes with the defect database 164 in the computer storage medium 156.

In some embodiments, the data analyzing unit 150 may send warning signals to an alarm 158 via the I/O interface 152. In some embodiments, the alarm 158 may be a display screen, a beeper, or a light to notify the operator. In other embodiments, the data analyzing unit 150 may send a warning signal to a system controller, such as the system controller 130 in FIG. 1.

In some embodiments, the data analyzing unit 150 may connect to a defect review module 160. The defect review module 160 may receive information of external reviews, such as SEM reviews, which may be used to improve the defect database 164.

FIG. 3C is a process diagram of the defect analyzing program 162 in the DDA module 140 according to embodiments of the present disclosure. The defect analyzing program 162 is configured to run in a computer processor to perform various functions. The defect analyzing program 162 may include a data collecting block 170, a defect binning block 172, a defect comparing block 174, and a warning block 176. In some embodiments, the defect analyzing program 162 may include a feedback block 178 configured to improve or train the defect database.

In the data collecting block 170, the defect analyzing program 162 may communicate with the data collectors 142 via the I/O interface 152 to obtain surface images captured by the data collectors 142. In some embodiments, the I/O interface 152 may communicate with multiple data collectors 142 positioned at various stations in the CMP tool.

In the defect binning block 172, the defect information is extracted and classified. The collected images include total defects, which include defects occurred prior to performing CMP process (pre-layer defects), and defects incurred during various stages of CMP process (CMP defects). In the defect binning block 172, defects are extracted by analyzing various images and extract defect attributes. CMP induced defects, such as scratches, concaves (dishing), particle contaminations, are read out using the defect attributes.

In the defect comparing block 174, the readout CMP defects are compared to the corresponding defects at the corresponding polishing stage stored in the defect database 164 to determine if the readout CMP defects are within a tolerance.

If the readout CMP defects are outside the tolerance, the defect comparing block 174 would send a trigger signal to the warning block 176. The warning block 176 may send a warning signal to the system controller 130 or to the system operator, so that remedial actions may be taken.

If the readout CMP defects are within the tolerance, the defect comparing block 174 would send a pass signal to allow the substrate to move to the next processing stage 180.

In some embodiments, if there is no queue time concern, the feedback block 178 is performed prior to the next processing stage 180. In the feedback block 178, the substrate with tolerable readout CMP defects is reviewed for actual defects, for example, by SEM review. The review result in the feedback block 178 is used to enhance the defect database 164. In some embodiments, algorithms for machine learning may be used to enhance the defect database 164 according to the feedback.

Figure 4:
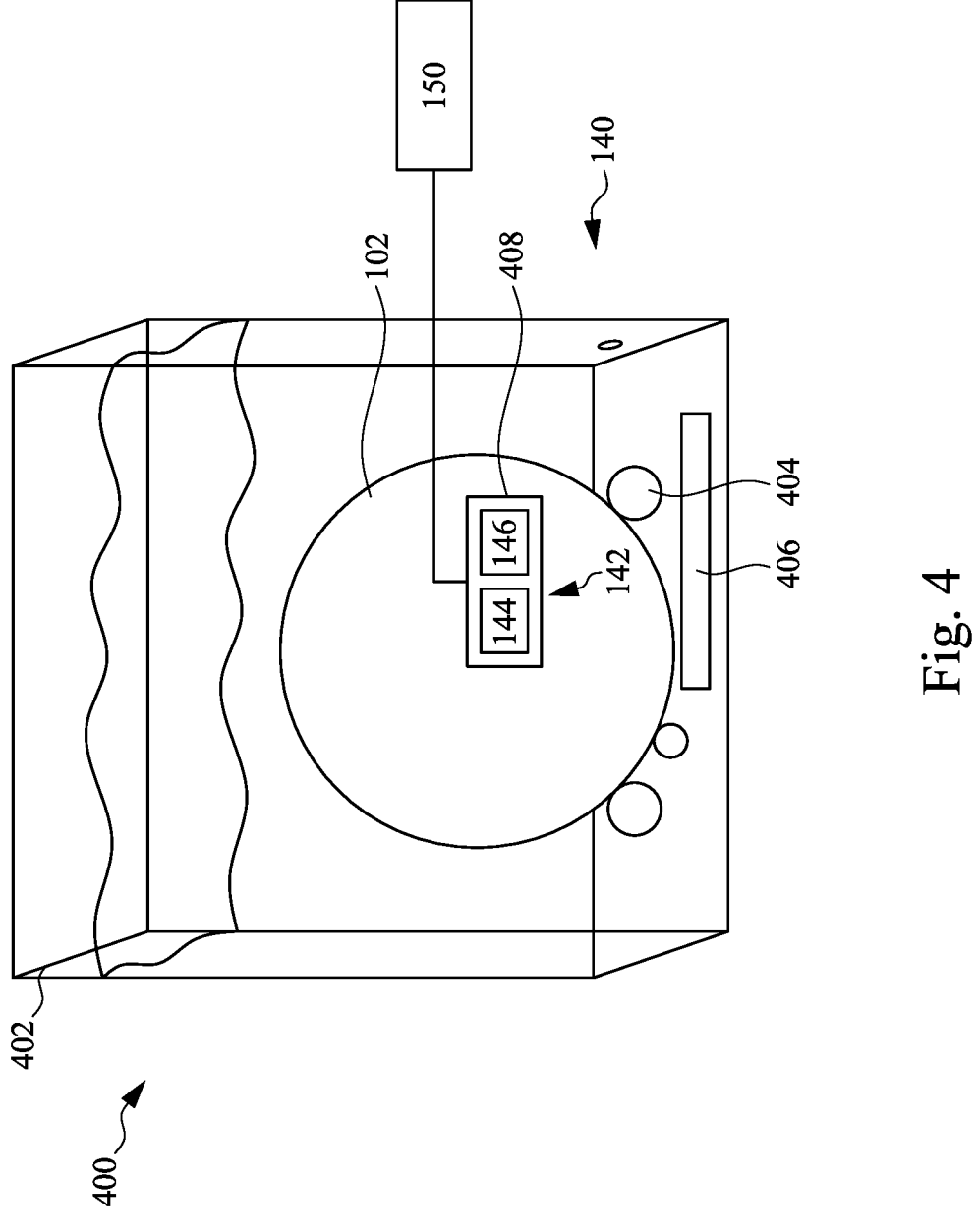
FIG. 4 is a schematic view of a cleaning tank having an integrated defect detection module according to embodiments of the present disclosure.

FIG. 4 is a schematic view of a cleaning tank 400 having with an integrated defect detection module according to embodiments of the present disclosure. The cleaning tank 400 may be a megasonic cleaning tank, which may be used as the first cleaning stage after polishing steps in a CMP process. In some embodiments, the cleaning tank 400 may be used as the cleaning station 126A in the CMP tool 100.

The cleaning tank 400 may include a washing basin 402 having rollers 404 disposed therein. During operation, the washing basin 402 may be filled with deionized water. A robot arm, such as a robot arm from the transfer module 110, may lower a substrate 102 into the washing basin 402 so that the substrate 102 is submerged in the deionized water. The rollers 404 rotate the substrate 102 while the substrate 102 is in the washing basin 402. The rollers 404 contact the edge of the substrate 102 and rotate the substrate 102 by friction force. In one embodiment, the rollers 404 rotate the substrate 102 between at a rate between 5 rpm and 20 rpm.

In some embodiments, the washing basin 402 includes one or more ultrasonic transducers 406. The ultrasonic transducers 406 receive electrical signals and generate corresponding ultrasonic vibrations in the deionized water of the cleaning tank 400. The ultrasonic vibrations from the ultrasonic transducers 406 can assist in cleaning the substrate 102.

In some embodiments, the DDA module 140 may be coupled to the cleaning tank 400 to enable defect detection during the first cleaning stage. In some embodiments, the data collectors 142 of the DDA module 140 may be disposed in the cleaning tank 400. For example, an aperture 408 may be formed through a wall of the washing basin 402 to expose a portion of the substrate 102 to the data collectors 142 of the DDA module 140. The data analyzing unit 150 may be disposed on or adjacent the cleaning tank 400. Alternatively, the data analyzing unit 150 may be located remote from the cleaning tank 400. In some embodiments, the data analyzing unit 150 may be shared data collectors disposed on other processing stations in the CMP tool.

Figure 5:
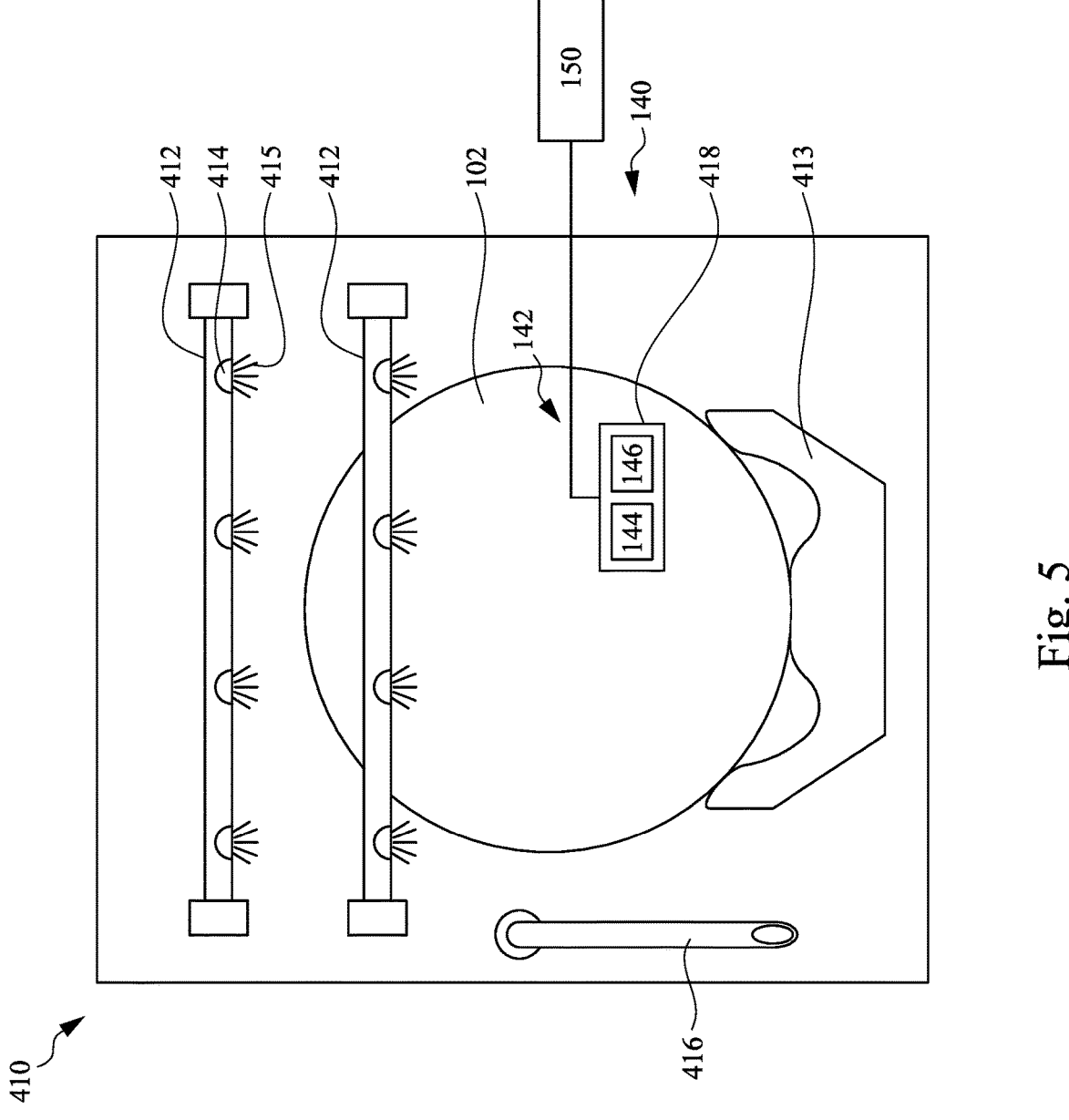
FIG. 5 is a schematic view of a pre-cleaning station having an integrated defect detection module according to embodiments of the present disclosure.

FIG. 5 is a schematic view of a pre-clean station 410 having with an integrated defect detection module according to embodiments of the present disclosure. In some embodiments, the pre-clean station 410 may be used as the cleaning station 126B for a second cleaning stage in the CMP tool 100.

During operation, a robot arm, such as a robot arm from the transfer module 110, may lower a substrate 102 into the pre-cleaning station 410. The substrate 102 rests on a roller system 413. The roller system 413 rotates the substrate 102. The roller system 413 can rotate the substrate with the rotational speed between 5 rpm and 20 rpm.

The pre-cleaning station 410 includes chemical spray bars 412. The chemical spray bars 412 include nozzles or apertures 414. The nozzles or apertures 414 spray a cleaning chemical solution 415 onto the substrate 102 to remove residue, particles, or CMP by-products. The cleaning chemical solution 415 is selected to preclean the substrate 102. In some embodiments, the cleaning chemical solution 415 includes isopropyl alcohol.

The pre-cleaning station 410 may include a cleaning arm 416. The cleaning arm 416 can include a head with the brush that is rotated to the substrate 102 and gently brushes or scrubs the surface of the substrate 102. The head of the cleaning arm 416 may also rotate such that the brush rotates while cleaning the surface of the substrate 102.

In some embodiments, the DDA module 140 may be coupled to the pre-cleaning station 410 to enable defect detection during the second cleaning stage. In some embodiments, the data collectors 142 of the DDA module 140 may be disposed in the pre-cleaning station 410. For example, an aperture 418 may be formed through the housing of the pre-cleaning station 410 to expose a portion of the substrate 102 to the data collectors 142 of the DDA module 140. The data analyzing unit 150 may be disposed on or adjacent the pre-cleaning station 410. Alternatively, the data analyzing unit 150 may be located remote from the pre-cleaning station 410. In some embodiments, the data analyzing unit 150 may be shared data collectors disposed on other processing stations in the CMP tool.

Figure 6:
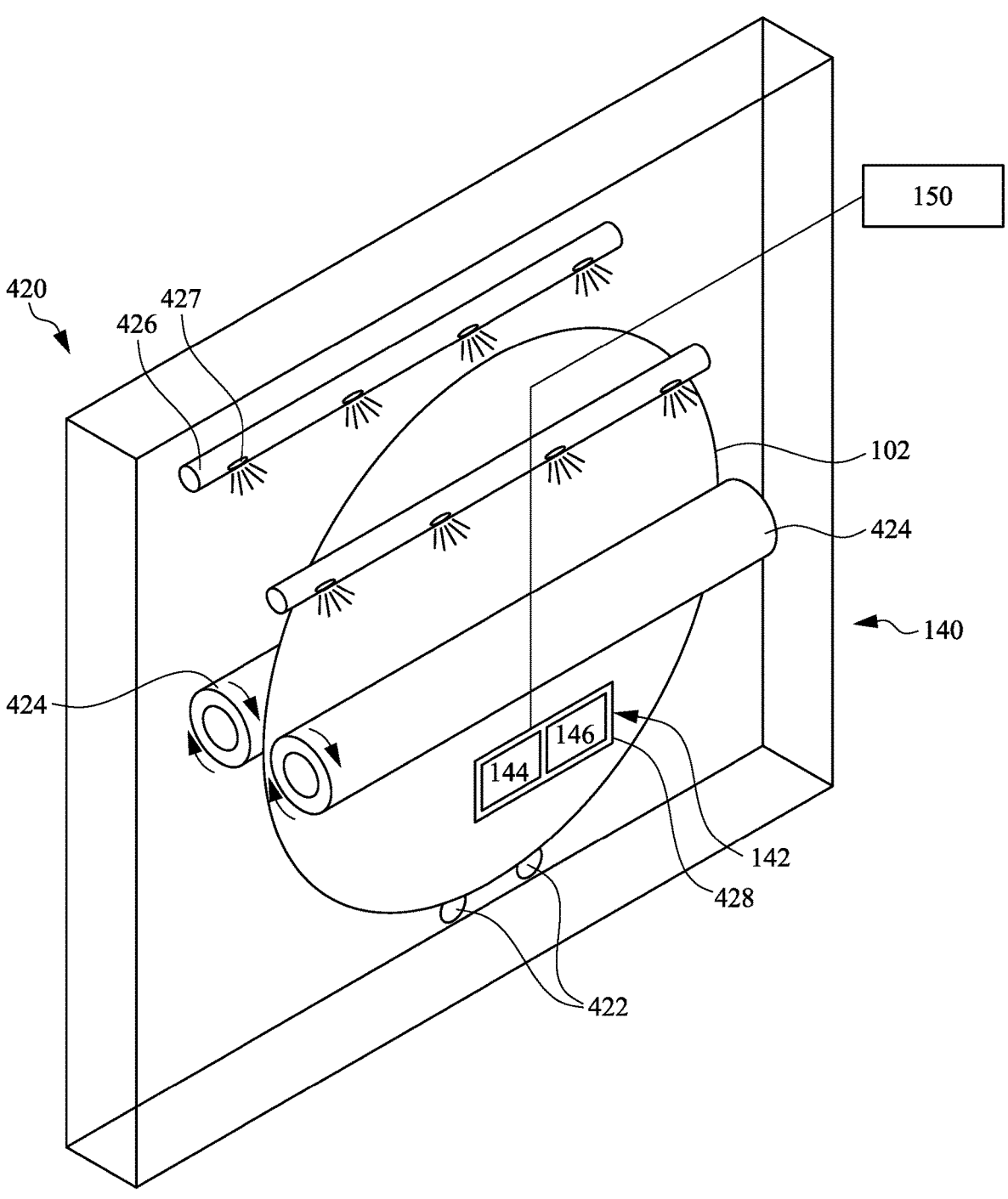
FIG. 6 is a schematic view of a brush box having an integrated defect detection module according to embodiments of the present disclosure.

FIG. 6 is a schematic view of a brush box 420 having with an integrated defect detection module according to embodiments of the present disclosure. In some embodiments, the brush box 420 may be used as the cleaning station 126C for a third cleaning stage in the CMP tool 100.

The brush box 420 includes roller brushes 424. The substrate 102 is positioned between the roller brushes 424. The roller brushes 424 rotate and clean the surfaces of the substrate 102. The brush box 420 also includes rollers 422 that rotate the substrate 102 while the roller brushes 424 clean the wafer. The roller brushes 424 are made from a nonabrasive, soft material that will not damage the surface of the substrate 102.

The brush box 420 also includes chemical spray bars 426. The chemical spray bars 426 include apertures or nozzles that spray a cleaning chemical 427 onto the surfaces of the substrate 102. The cleaning chemical 427 can include ethyl glycol. The cleaning chemical 427 can include other chemicals without departing from the scope of the present disclosure.

In some embodiments, the DDA module 140 may be coupled to the brush box 420 to enable defect detection during the third cleaning stage. In some embodiments, the data collectors 142 of the DDA module 140 may be disposed in the brush box 420. For example, an aperture 428 may be formed through the housing of the brush box 420 to expose a portion of the substrate 102 to the data collectors 142 of the DDA module 140. The data analyzing unit 150 may be disposed on or adjacent the brush box 420. Alternatively, the data analyzing unit 150 may be located remote from the brush box 420. In some embodiments, the data analyzing unit 150 may be shared data collectors disposed on other processing stations in the CMP tool.

Figure 7:
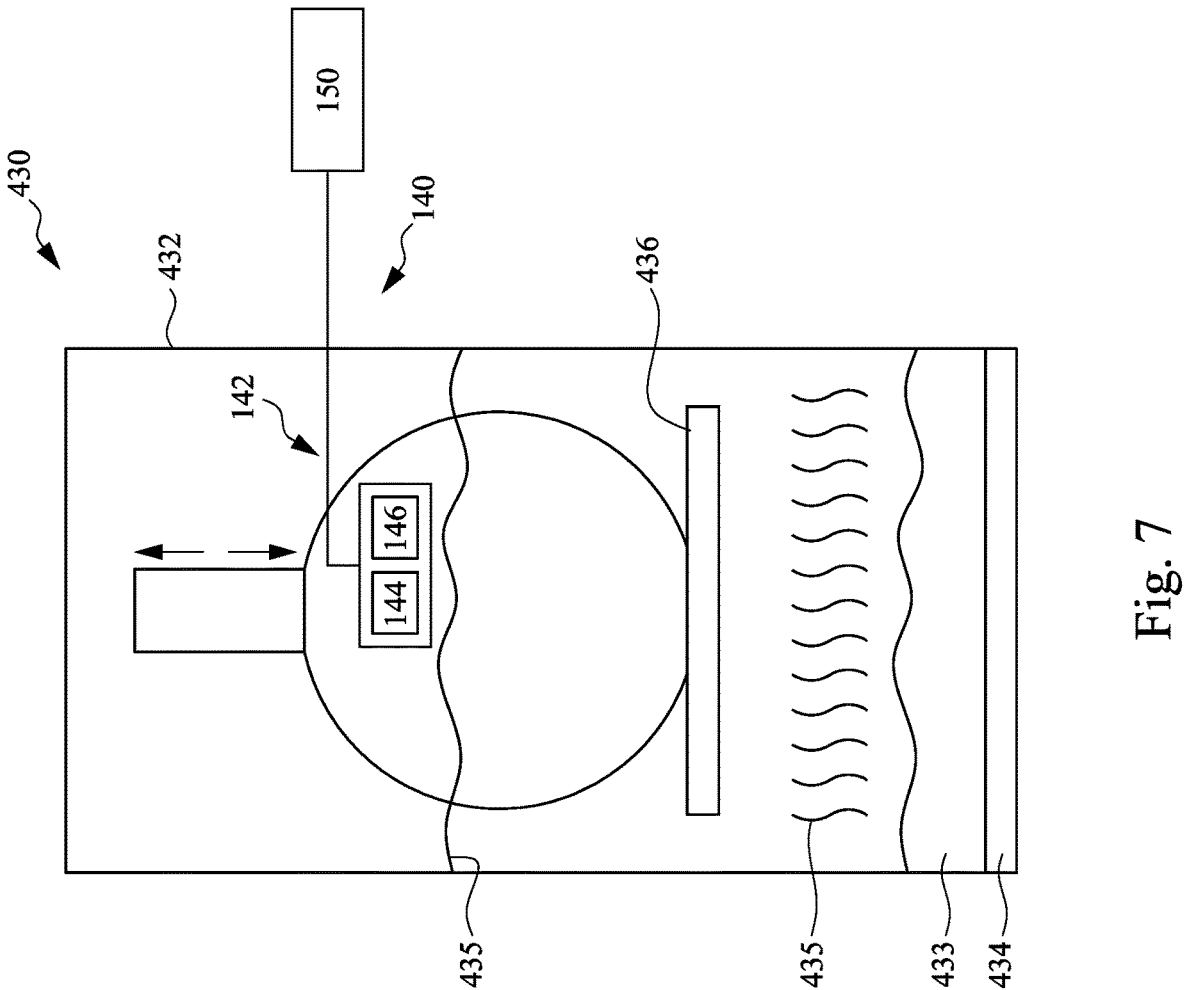
FIG. 7 is a schematic view of a dryer having an integrated defect detection module according to embodiments of the present disclosure.

FIG. 7 is a schematic view of a dryer 430 having with an integrated defect detection module according to embodiments of the present disclosure. In some embodiments, the dryer 430 may be used as the cleaning station 128 for a fourth cleaning stage in the CMP tool 100.

The dryer 430 may be a vapor dryer. The dryer 430 may include a housing 432 and a lift 436 configured to lift a substrate 102 in and out the housing 432. The dryer 430 also includes a heater 434. During operation, a pool of a liquid chemical 433 is disposed near the bottom. The heater 434 heats the liquid chemical 433 generating a vapor 435 from the liquid chemical 433. The vapor 435 rises in the housing 432 of the dryer 430. The lift 436 lowers the substrate 102 into the vapor 435. The vapor 435 has the effect of pushing deionized water and other chemicals off the surface of the substrate 102. This is accomplished due to the different surface tensions of the vapor and the remaining deionized water or other chemicals. In some embodiments, the liquid chemical 433 is isopropyl alcohol. The vapor 435 is an isopropyl alcohol vapor. The isopropyl alcohol vapor dries the surface of the substrate 102 by pushing remaining deionized water and other chemicals off the surface of the substrate 102.

In some embodiments, the DDA module 140 may be coupled to the dryer 430 to enable defect detection during the third cleaning stage. In some embodiments, the data collectors 142 of the DDA module 140 may be disposed in the dryer 430. The data collectors 142 of the DDA module 140 may be disposed above the vapor 435 to capture images of the substrate surface. The data analyzing unit 150 may be disposed on or adjacent the dryer 430. Alternatively, the data analyzing unit 150 may be located remote from the dryer 430. In some embodiments, the data analyzing unit 150 may be shared data collectors disposed on other processing stations in the CMP tool.

Figure 8:
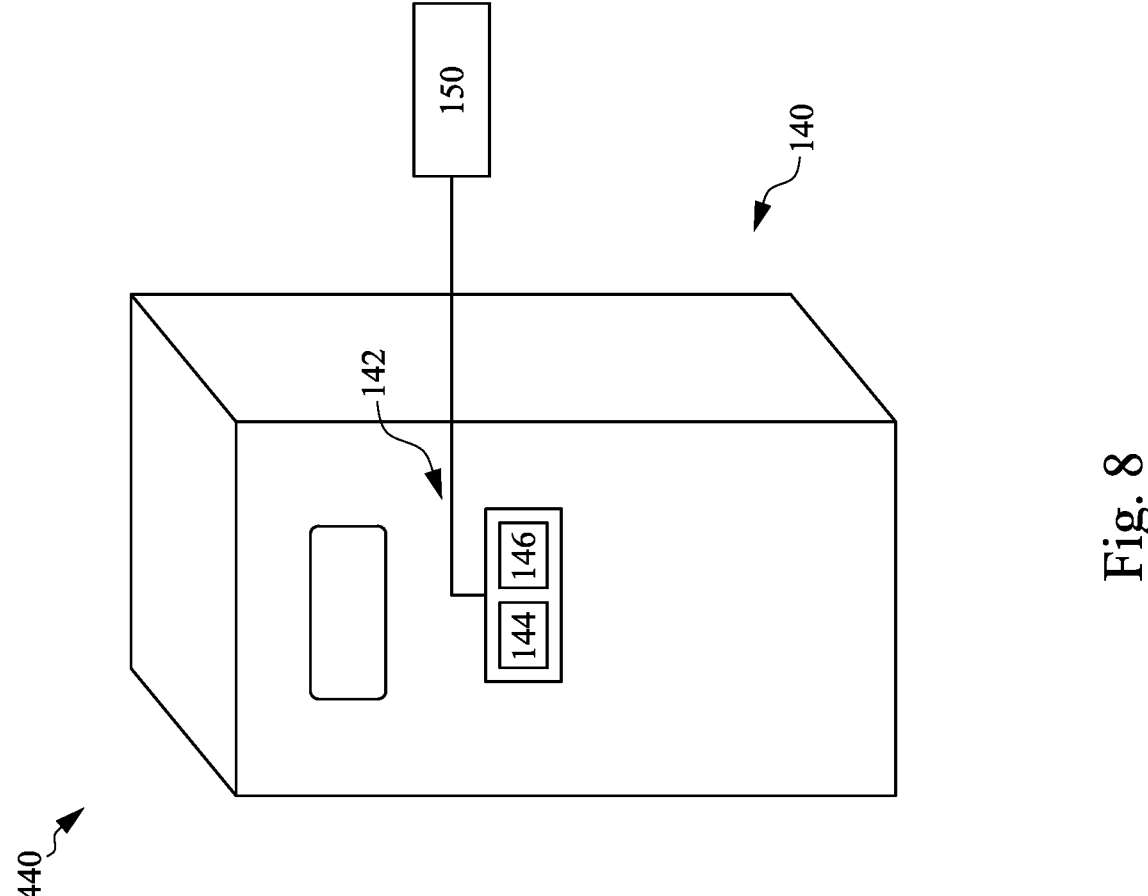
FIG. 8 is a schematic view of an integrated metrology unit having an integrated defect detection module according to embodiments of the present disclosure.

FIG. 8 is a schematic view of an integrated metrology tool 440 having with an integrated defect detection module according to embodiments of the present disclosure. In some embodiments, the integrated metrology tool 440 may be used as the metrology tool 115 in the CMP tool 100. In some embodiments, the DDA module 140 according to the present disclosure may be included in a conventional metrology tool to capture and transfer images of substrates for defect detection.

Figure 9A:
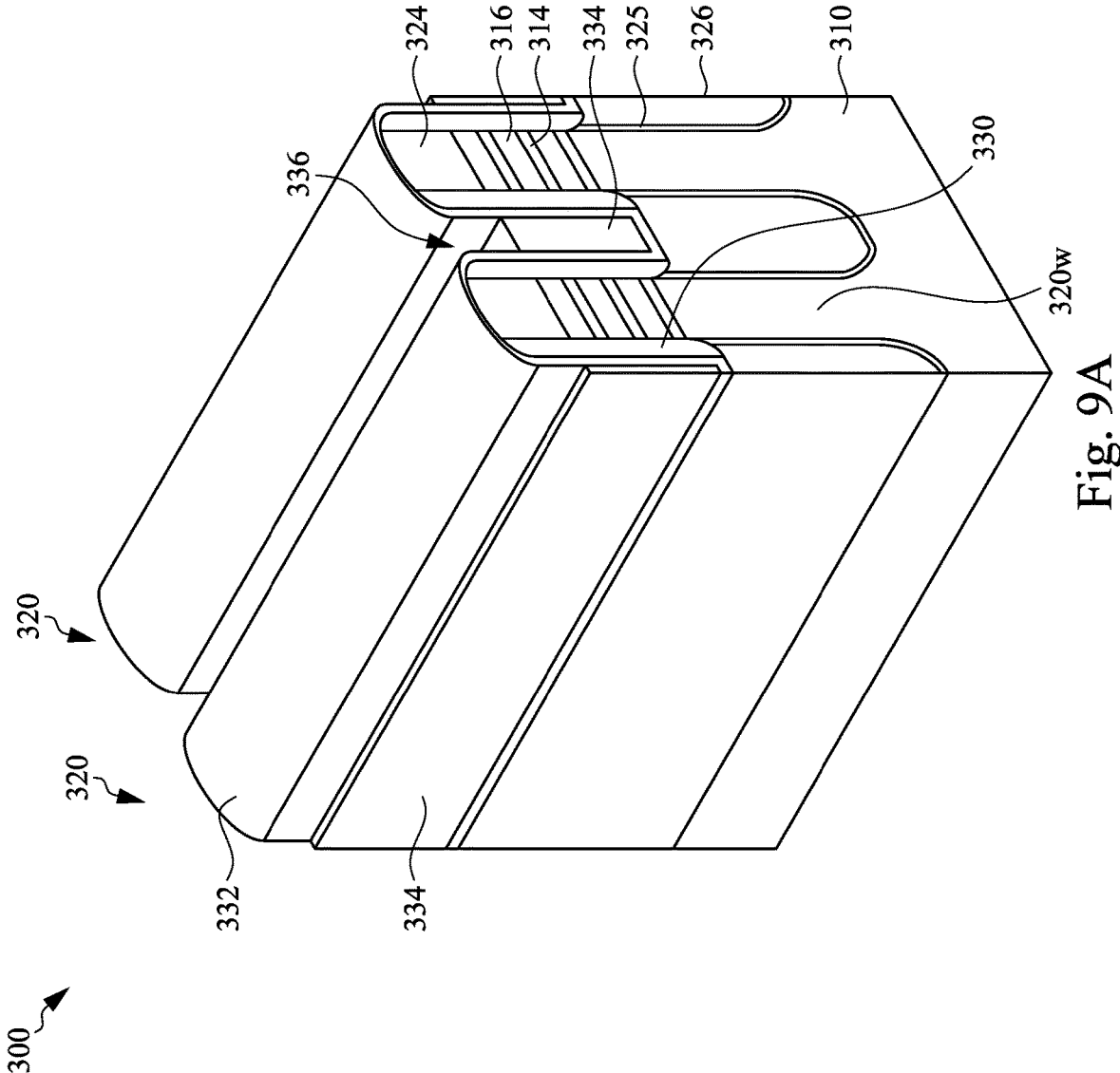
FIGS. 9A-9B, 10A-10B, and 11A-11B schematically illustrate a semiconductor device during fabrication at various stage of processing.
Figure 9B:
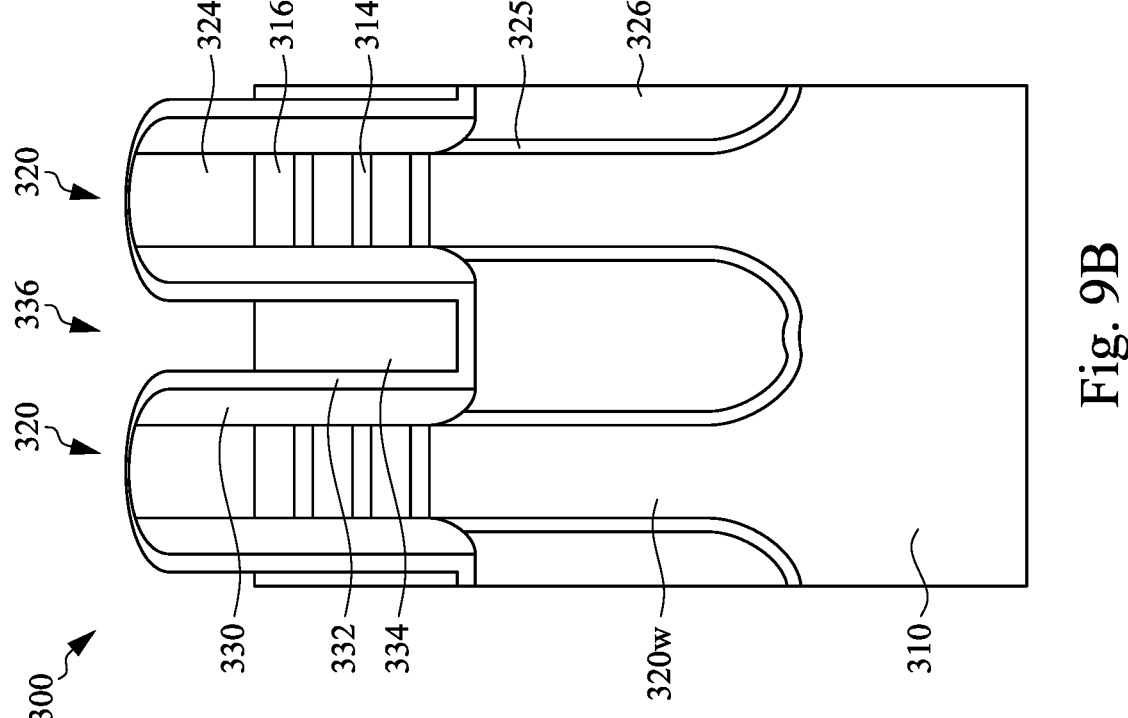
Figure 10A:
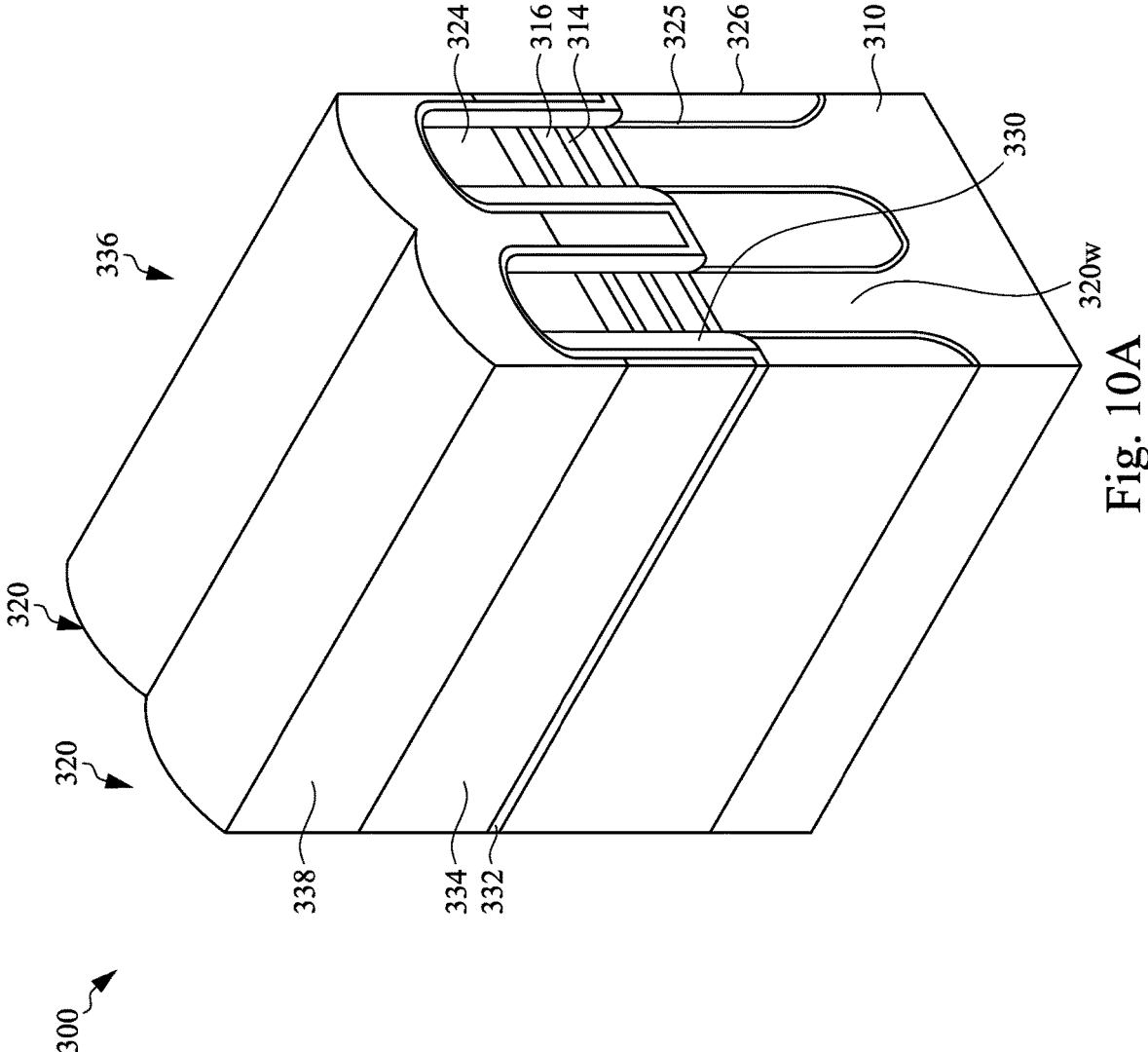
Figure 10B:
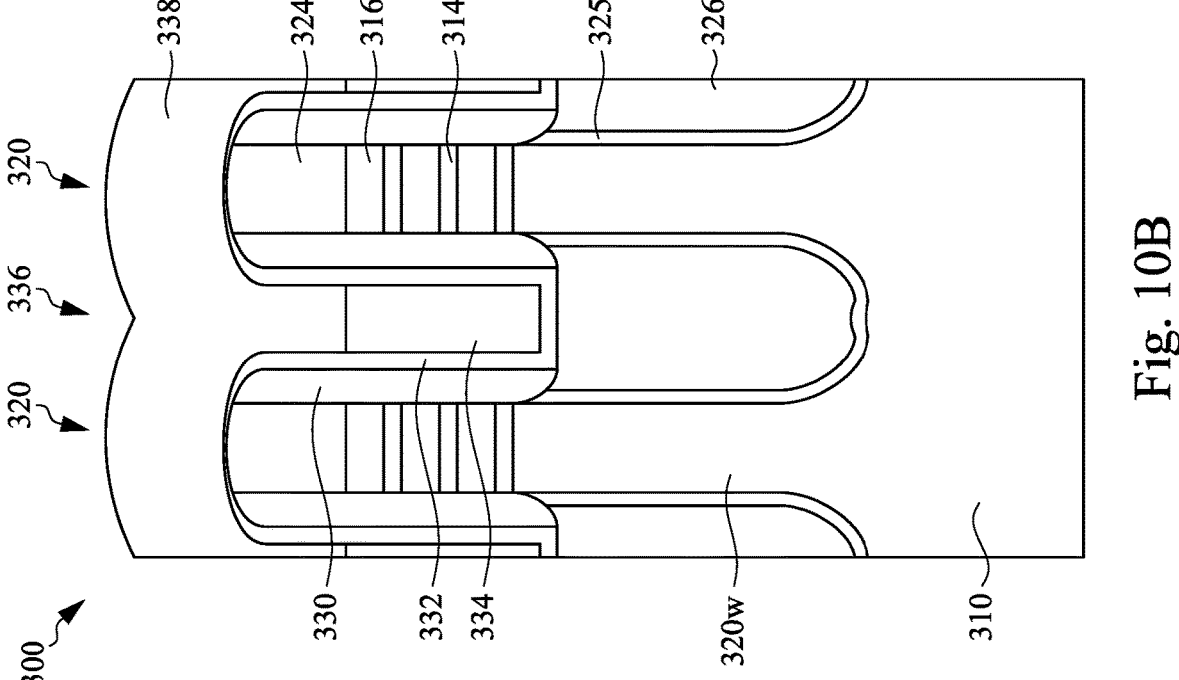
Figure 11A:
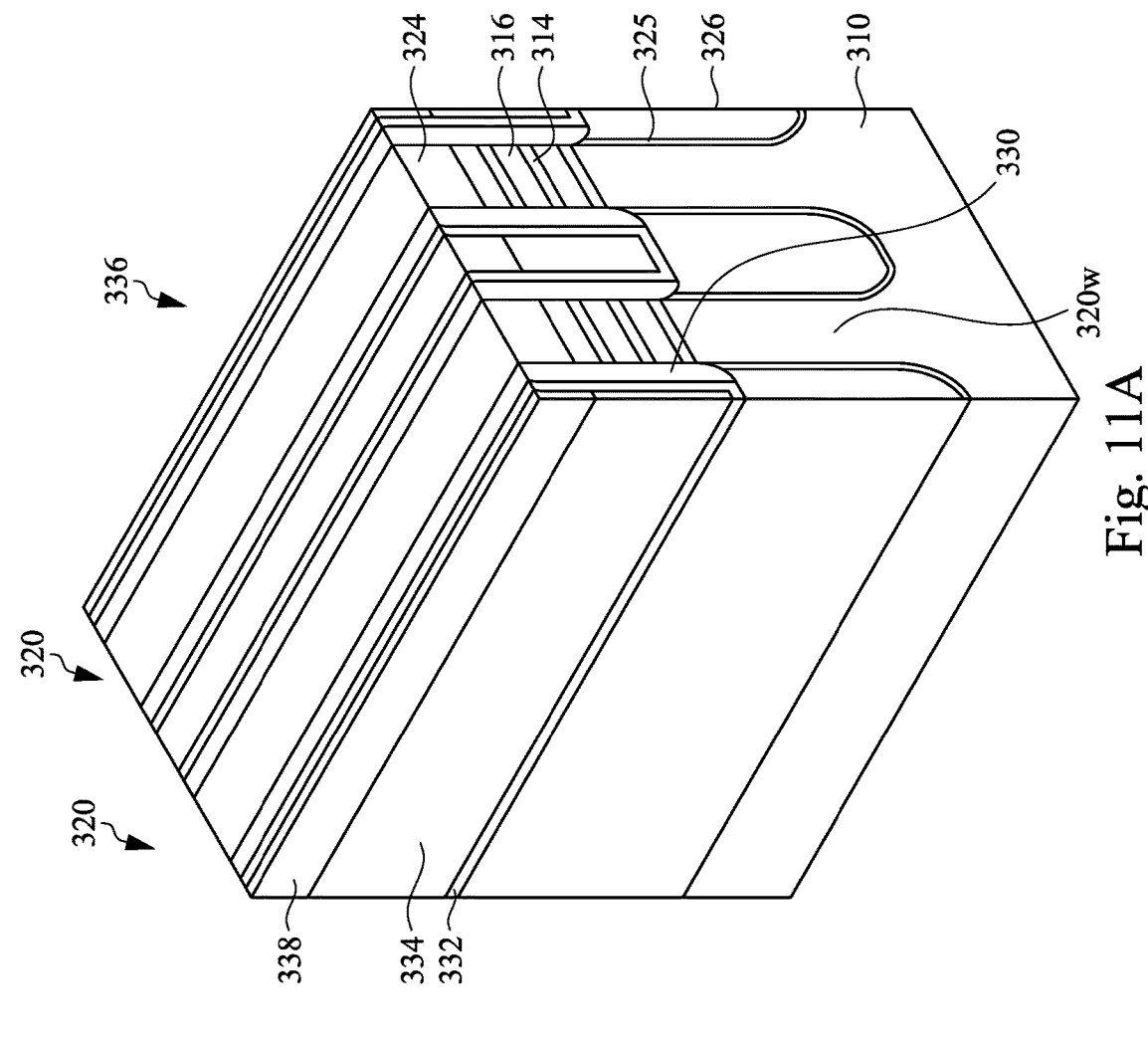
Figure 11B:
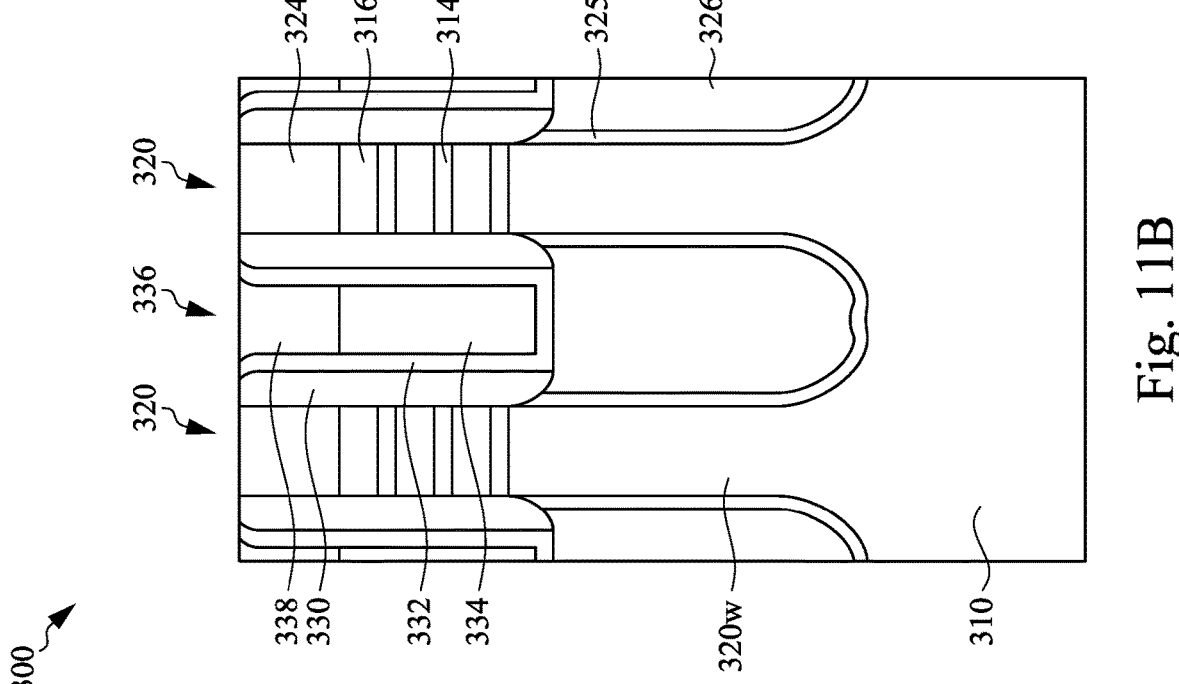

Embodiments of the present disclosure improves yield, particularly when substrates being polished including hydrophobic materials. FIGS. 9A-9B, 10A-10B, and 11A-11B schematically illustrate a semiconductor device 300 during fabrication at various stage of processing. A CMP process according to the present disclosure is performed when fabricating the semiconductor device 300 with in-situ defect detection. FIGS. 9A, 10A, 11A are schematic partial perspective views of the semiconductor device 300. FIGS. 9B, 10B, 11B are schematic sectional views of the semiconductor device 300.

In FIGS. 9A-9B, the semiconductor device 300 includes semiconductor fin 320 for gate all around (GAA) transistors. The semiconductor device 300 are formed in or on a substrate 310. The substrate 310 may include a single crystalline semiconductor material such as, but not limited to Si, Ge, SiGe, GaAs, InSb, GaP, GaSb, InAlAs, InGaAs, GaSbP, GaAsSb, and InP. The semiconductor fins 320 extend from the substrate 310. Each semiconductor fin 320 includes a well portion 320w formed from the substrate 310, and two or more semiconductor layers 314, 316 alternatively stacked over the well portion 320w.

The semiconductor layer 314 is eventually removed with replacement gate structure. Portions of the semiconductor layer 316 become channel in the final device. In some embodiments, the semiconductor layer 314 may include silicon germanium (SiGe). The semiconductor layer 316 may include Si, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof.

A mask layer 324 is disposed over the semiconductor fins 320. The mark layer 324 is used during the patterning process as of the semiconductor fins 320. The mask layer 324 may include any suitable material that provide an etch selectivity with the semiconductor layers 314, 316, and the substrate 310. In some embodiments, the mask layer 324 include silicon oxide.

An isolation layer 326 is formed in the trenches between the semiconductor fins 320. The isolation layer 326 cover at least a part of the well portions 320w of the semiconductor fins 320. The isolation layer 326 may include silicon oxide, silicon nitride, silicon oxynitride, fluorine-doped silicate glass (FSG), a low-k dielectric, combinations thereof. In some embodiments, a liner 325 may be formed between the isolation layer 326 and the semiconductor fins 320. In some embodiments, the liner 325 and the isolation layer 326 are deposited to cover the semiconductor fins 320 by a suitable deposition process to fill the trenches between the semiconductor fins 320, and then recess etched using a suitable anisotropic etching process to expose the semiconductor layers 314, 316 of the semiconductor fins 320.

A cladding layer 330 is formed on sidewalls of the semiconductor fins 320. In some embodiments, the cladding layer 330 includes a semiconductor material, for example SiGe. Hybrid fins 336 are then formed in the trenches between the semiconductor fins 320 between the cladding layer 330. In FIGS. 10A-10B, the hybrid fins 336 are bi-layer structures including a dielectric liner layer 332 and a dielectric filling layer 334. In some embodiments, the dielectric liner layer 332 may include a low-k material, such as SiONC, SiCN, SiOC, or other dielectric material, that provide etch resistance during replacement gate processes. The dielectric filling layer 334 may be a low-k dielectric material, such as silicon oxide. The dielectric filling layer 334 may be deposited and then recess etched back to a desired level as shown in FIGS. 14A-14B. In some embodiments, the dielectric filling layer 334 are substantially at the same level as a top surface of the topmost semiconductor layer 316.

In FIGS. 10A-10B, a high-k dielectric layer 338 is formed by a blanket deposition. The high-k dielectric layer 338 may include a material having a k value greater than 7, such as $HfO_2$, $ZrO_2$, HfAlOx, HfSiOx, or $Al_2O_3$. Any suitable deposition process, such as a CVD, PECVD, FCVD, or ALD process, may be used to deposit the high-k dielectric material.

In FIGS. 11A-11B, after formation of the high-k dielectric layer 338, a planarization is performed to expose the hard mask layer 324 resulting in a top surface including areas of the high-k dielectric layer 338, the cladding layer 330, the hard mask layer 324, and the dielectric liner layer 332. Because particles of the high-k material in the high-k dielectric layer 338 are hydrophobic and are easily attracted to other surface areas of silicon oxide, e.g., the hard mask layer 324, or surface areas of semiconductors, e.g., the cladding layer 330, the particles of high-k material increase defects on the substrate being polished. The defects can be reduced using the method and/or CMP tools according to the present disclosure. Particularly, particle contamination is reduced by keeping the substrate surface wet in the polishing tool. For example, immersing the substrate in a wetting solution or spraying the substrate with a wetting solution during substrate transfer or idle time. The wetting solution may be deionized water. In some embodiments, the wetting solution may be deionized water with one or more additives, such as a surfactant, a photocatalyst, carbon dioxide, and ozone.

Various embodiments or examples described herein offer multiple advantages over the state-of-art technology. Embodiments of present disclosure provide a CMP tool and methods thereof enabling automatic defect classification to identify CMP-induced defects. Because data collectors are disposed on processing stations in the CMP tool, in-situ monitoring of defectivity level is enabled in each processing station in the CMP tool. By reviewing defect information from data collectors, source of defects may be identified. Embodiments of the present disclosure substantially reduce defect readout cycle time, from about 42 hours to less than 1 hour. The reduced defect readout cycle time decreases wafer scrap risk caused by potential defect issued in the CMP tool, increases defect capture accuracy by enlarging machine learning database. The defect data analyzer according to the present disclosure provides fast defect readout and precise location of the source of defect, therefore making it easier to engineers to maintain a CMP production line.

It will be understood that not all advantages have been necessarily discussed herein, no particular advantage is required for all embodiments or examples, and other embodiments or examples may offer different advantages.

Some embodiments of the present provide a method. The method comprises processing a substrate in a CMP (chemical mechanical polishing) tool, wherein the CMP tool comprises a defect data analyzer (DDA); collecting surface information while the substrate is being processed in the CMP tool; identifying CMP induced defects from the surface information in the defect data analyzer (DDA); comparing the CMP induced defects with a defect database to determine if the CMP induced defects are outside a tolerance; and sending a warning signal if the CMP induced defects are outside the tolerance.

Some embodiments of the present disclosure provide a system for monitoring defects in a CMP tool. The system comprises a data collector disposed in a processing station of the CMP tool; and a defect data analyzer connected to the data collector, comprising: processor; and a computer readable medium connected to the processor, wherein the computer readable medium contains a program configured to cause the processor to perform operations comprising: collecting surface information of a substrate in the processing station of the CMP tool using the data collector during processing; and identifying CMP induced defects from the surface information.

Some embodiments of the present disclosure provide a CMP tool. The tool comprises: a plurality of processing stations; and a defect detection analyzer comprising: a first data collector disposed in a first processing station of the plurality of processing stations, wherein the first data collector is configured to collect surface information from a surface of a substrate being processed in the first processing station; and a defect analyzer connected to the first data collectors and configured to extract defect attributes from surface information collected by the first data collectors and classify defects according to the defect attributes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
processing a substrate in a CMP (chemical mechanical polishing) tool, wherein the CMP tool comprises a defect data analyzer (DDA);
collecting surface information while the substrate is being processed in the CMP tool;
identifying CMP induced defects from the surface information in the defect data analyzer (DDA);
comparing the CMP induced defects with a defect database to determine if the CMP induced defects are outside a tolerance; and
sending a warning signal if the CMP induced defects are outside the tolerance.

2. The method of claim 1, wherein the CMP tool comprises a first processing station, wherein a first data collectors is disposed in the first processing station.

3. The method of claim 2, wherein collecting the surface information comprises taking one or more first images of a surface of the substrate using the first data collectors while the substrate is being processed in the first processing station.

4. The method of claim 3, wherein taking the one or more first images of the surface comprises:
illuminating the surface of the substrate with an impinging light beam; and
taking the first images with two or more high-speed cameras disposed at different angles.

5. The method of claim 4, wherein illuminating the surface of the substrate comprises switching between a normal light beam and an oblique light beam.

6. The method of claim 4, further comprising polarizing the impinging light beam.

7. The method of claim 1, wherein identifying the CMP induced defects comprises:
extracting defect attributes from the surface information; and
classifying defects using the defect attributes.

8. The method of claim 1, further comprising:
reviewing the CMP induced defects using a SEM (scanning electron microscopy) after comparing the CMP induced defects with the defect database; and
updating the defect database using review results.

9. The method of claim 3, wherein collecting the surface information further comprises:
taking one or more second images of the surface of the substrate using a second data collectors while the substrate is being processed in a second processing station in the CMP tool.

10. A system for monitoring defects in a CMP tool, comprising:
a data collector disposed in a processing station of the CMP tool; and and
a defect data analyzer connected to the data collector, comprising:
a processor; and
a computer readable medium connected to the processor, wherein the computer readable medium contains a program configured to cause the processor to perform operations comprising:

collecting surface information of a substrate in the processing station of the CMP tool using the data collector during processing; and identifying CMP induced defects from the surface information.

11. The system of claim 10, further comprising a defect database stored in the computer readable medium, wherein the operations further comprise:

comparing the CMP induced defects with the defect database to determine if the CMP induced defects are outside a tolerance; and sending a warning signal if the CMP induced defects are outside the tolerance.

12. The system of claim 11, wherein the operations further comprise:

updating the defect database according to feedback from review of the CMP induced defects.

13. The system of claim 10, wherein identifying the CMP induced defects from the surface information:

extracting defect attributes from the surface information; and classifying defects using the defect attributes.

14. A CMP tool, comprising:

a plurality of processing stations; and a defect detection analyzer comprising:

a first data collector disposed in a first processing station of the plurality of processing stations, wherein the first data collector is configured to collect surface information from a surface of a substrate being processed in the first processing station; and a defect analyzer connected to the first data collectors and configured to extract defect attributes from surface information collected by the first data collectors and classify defects according to the defect attributes.

15. The CMP tool of claim 14, wherein the defect detection analyzer comprising:

a second data collector disposed in a second processing station of the plurality of processing stations, wherein the second data collector is configured to collect surface information from the substrate being processed in the second processing station, and the second data collector is connected to the defect analyzer.

16. The CMP tool of claim 14, wherein the first data collector comprises:

an illuminator configured to direct light beams toward the surface of the substrate; and a first high-speed camera.

17. The CMP tool of claim 16, wherein the first processing station is a polishing station comprises a platen and a polishing pad, wherein an aperture is formed through the polishing pad, and the illuminator directs light beams through the aperture.

18. The CMP tool of claim 16, wherein the illuminator comprises:

a first light source configured to impinge a normal light beam toward the surface; and a second light source configured to impinge an oblique light beam towards the surface.

19. The CMP tool of claim 18, wherein the first light source comprises a polarizer.

20. The CMP tool of claim 16, wherein the first data collector comprises a second high-speed camera and a third high-speed camera, the first high-speed camera is perpendicular to the substrate, and the second and the third high-speed camera are disposed at angle relative to the substrate.

* * * * *